United States Patent
Kania et al.

(10) Patent No.: US 10,564,193 B2
(45) Date of Patent: Feb. 18, 2020

(54) ENERGY MONITORING AND ANALYSIS SYSTEM

(71) Applicants: Jason Kania, Ottawa (CA); Andrew Rust, North Gower (CA); Patrick Cavanaugh, Almonte (CA); Thomas Heaven, Manotick (CA)

(72) Inventors: Jason Kania, Ottawa (CA); Andrew Rust, North Gower (CA); Patrick Cavanaugh, Almonte (CA); Thomas Heaven, Manotick (CA)

(73) Assignee: OnBalance Technologies Inc., Ontario (CA)

( * ) Notice: Subject to any disclaimer, the term of this patent is extended or adjusted under 35 U.S.C. 154(b) by 319 days.

(21) Appl. No.: 14/700,852

(22) Filed: Apr. 30, 2015

(65) Prior Publication Data

US 2015/0316594 A1 Nov. 5, 2015

Related U.S. Application Data

(60) Provisional application No. 61/986,531, filed on Apr. 30, 2014.

(51) Int. Cl.
*G01R 21/00* (2006.01)
*G01R 21/133* (2006.01)

(52) U.S. Cl.
CPC ................... *G01R 21/133* (2013.01)

(58) Field of Classification Search
CPC ....................................................... G01R 21/06
USPC .......................................................... 702/60
See application file for complete search history.

(56) References Cited

U.S. PATENT DOCUMENTS

| | | | | |
|---|---|---|---|---|
| 6,866,544 | B1* | 3/2005 | Casey | H05K 9/0058 439/607.2 |
| 2003/0208314 | A1* | 11/2003 | Funk | G01C 21/3688 701/500 |
| 2005/0261559 | A1* | 11/2005 | Mumford | A61B 5/0002 600/300 |
| 2006/0052914 | A1* | 3/2006 | Kubokawa | H05K 7/1432 701/21 |
| 2009/0206059 | A1* | 8/2009 | Kiko | H02J 3/14 218/143 |
| 2011/0208450 | A1* | 8/2011 | Salka | H01H 9/167 702/62 |
| 2011/0310585 | A1* | 12/2011 | Suwa | H05K 7/20927 361/820 |
| 2013/0119972 | A1* | 5/2013 | Maguire | G01R 35/005 324/74 |
| 2013/0211751 | A1* | 8/2013 | Park | G01R 21/06 702/61 |
| 2014/0088780 | A1* | 3/2014 | Chen | G05F 1/66 700/295 |

(Continued)

*Primary Examiner* — Min Huang
(74) *Attorney, Agent, or Firm* — Taft Stettinius & Hollister LLP

(57) ABSTRACT

An energy monitoring and analysis system is provided. Sensors are attached to circuit breakers to collect energy consumption data. The energy consumption data is analyzed to determine events associated with the circuit. An energy monitoring system comprising a paddle having one or more sensors can be affixed to existing circuit breakers and provide communication with the energy analysis system. From the events notifications and alerts can be generated to inform consumers such as a utility, monitoring company or end user.

20 Claims, 23 Drawing Sheets

(56) References Cited

U.S. PATENT DOCUMENTS

| | | | |
|---|---|---|---|
| 2015/0002137 A1* | 1/2015 | Patel | G01R 15/207 |
| | | | 324/130 |
| 2016/0224083 A1* | 8/2016 | Dent | G06F 1/266 |
| 2016/0305797 A1* | 10/2016 | Pietrasik | G01D 9/00 |
| 2016/0370814 A1* | 12/2016 | Hanley | G05F 1/66 |

* cited by examiner

ENERGY MONITORING AND ANALYSIS SYSTEM

CROSS-REFERENCE TO RELATED APPLICATIONS

This application claims priority from U.S. Provisional Application No. 61/986,531 filed Apr. 30, 2014 the entirety of which is hereby incorporated by reference for all purposes.

TECHNICAL FIELD

The present disclosure relates to the field of energy usage monitoring, analysis and control. More specifically, the present disclosure relates to monitoring energy consumption and energy usage patterns at the circuit level at a breaker panel.

BACKGROUND

There are many known devices for measuring energy usage in an electrical circuit. Some involve insertion of components within a circuit to measure the current consumption. Others measure the electrical current without making contact with the circuit using technologies such as an inductive wire coil or by using a sensor that makes use of the Hall Effect. Most of these devices involve the placement of a coil or Hall-effect sensor within proximity to the conductor carrying the current that is to be measured and used in the calculation of energy consumption. These devices are typically designed to sense the current from one circuit at a time and communicate the information to a device that may display the reading or forward the information on to a central system.

Standard electricity meters used by the electricity suppliers for billing may aggregate the usage from a number of circuits, but they effectively measure this usage only as the total usage from all circuits at a point in time. However, measuring the electrical consumption from a number of circuits in parallel to get a system-level view of energy use typically requires the placement of individual sensors for each circuit and wiring of these sensors to a collection device.

In larger installations, such as industrial facilities, the current consumption in multiple circuits will usually be measured in parallel. Such systems are often wired in at the time the electrical circuit is installed and require the installation services of electricians. Given the labor costs associated with installation, such systems are not typically practical or available for homeowners and non-industrial businesses.

Therefore there is a need for an improved energy monitoring system that enables energy usage patterns and consumption to be determined at a circuit breaker level.

DETAILED DESCRIPTION

Figure 1:
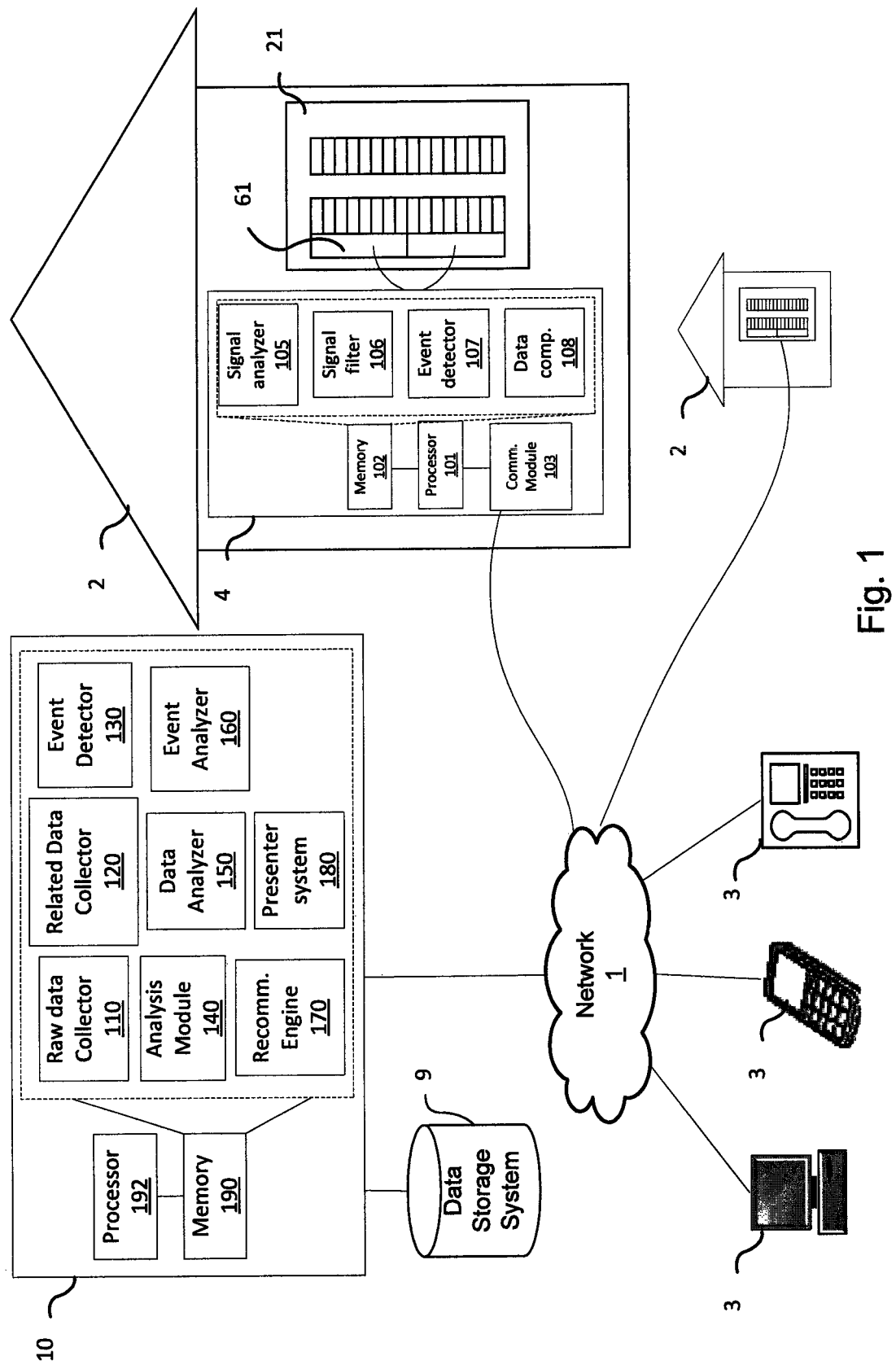
FIG. 1 is a system level diagram of the energy analysis system.

In accordance with an aspect of the present disclosure there is provided an energy monitoring system for monitoring power usage in a circuit breaker, the system comprising: a paddle module; one or more sensor modules extending from the paddle module, the sensor modules affixing to an external portion of a circuit breaker in a circuit breaker panel, each sensor module for determining energy consumption associate with the circuit breaker; and a communication module coupled to the paddle module for relaying energy consumption data from the one or more circuit breakers to a management system.

In accordance with another aspect of the present disclosure there is provided an energy monitoring and analysis system comprising: an energy monitoring system comprising: a processor; a memory containing instruction which when executed by the processor for performing: receiving energy consumption data from a sensor modules extending from a paddle module, the sensor modules affixing to an external portion of a circuit breaker in a circuit breaker panel, each sensor module for determining energy consumption associate with the circuit breaker; determining an event from the received energy consumption data; and sending the energy consumption data associated with the event to a network. There is further provided an energy analysis system comprising: a processor; a memory containing instruction which when executed by the processor for performing: receiving energy consumption data from the energy monitoring system through the network from the energy monitoring system; determining a profile of one or more loads connected to the circuit breaker associated with the consumption data; determining a notification or alert from the received energy consumption data based upon the profile; and sending the notification or alert to a consumer associated with the energy monitoring system.

In accordance with yet another aspect of the present disclosure there is provided a non-transitory computer readable memory containing instructions which when executed by a processor performing: receiving consumption data from a plurality of sensor modules extending from a paddle module, the sensor modules affixing to an external portion of a circuit breaker in the circuit breaker panel, each sensor module for determining energy consumption associate with the circuit breaker; determining an event from the received energy consumption data; and sending the energy consumption data associated with the event an energy analysis system.

Most homes and businesses do not have access to a detailed breakdown of their energy consumption or any idea of the actions that they could take with regard to their energy use. However, this information is necessary if they are to seek efficiencies when using energy or if they are to learn about their patterns of energy use. Current point solutions exist, but only allow a view of a single or a handful of circuits at a time. The existing solutions lack the ability to scale in order to provide a premises-level view of energy usage or to identify the actions that an energy consumer or provider can take to receive benefit. Existing solutions also require considerable manual effort for installation that creates a barrier to mass deployment of such technologies.

In part, this problem exists due to the fact that breaker panels and circuit breakers come in a large number of formats making a single solution for collecting this energy consumption information for subsequent analysis a challenge.

The present disclosure provides a complete energy monitoring and analysis system that consists of software and hardware for gathering energy usage information and analyzing it in order to provide energy consumers with detailed information on their energy usage and specific actions that they can take that will provide them benefit. The software analyzes energy consumption information gathered from businesses and homes as well as information collected from external Internet sources and existing equipment. The system may provide the results of the analysis as feedback to energy producers, to the owners of the premises and as input to any devices that may be able to make use of the information. The information generated by the energy analysis system can be used in a number of areas including detailed energy cost analysis, smart grid management, demand side management, security, preventative maintenance and assisted living.

There is also provided the hardware used in the system that can be rapidly and consistently installed into breaker panels from different vendors. The hardware exists in the form of a modular system of electronic and plastic parts that may be assembled on a customer premises into a communication system with customized sensor paddles capable of monitoring most of the circuits in a breaker panel simultaneously. Once installed, these sensor paddles collect the energy consumption information that is passed to the remote analysis network for analysis.

Through the use of the mentioned modular components, the paddles are customized for each brand and site-specific configuration of circuit breaker and panel. The different form factors of sensors and sensor paddles each attach to the circuit breakers from a specific vendor non-intrusively such that on-site installation requires no tools and may avoid interruption of power in many cases. During installation, the sensor paddles register themselves to a consistent location relative to the circuit breakers when directed force is used to attach the paddles to the circuit breakers. This allows installation of the energy monitoring system to be repeatable without tools and with minimal skill required on the part of the installer. It also allows a number of circuits to become monitored with a single rapid installation action.

Figure 35:
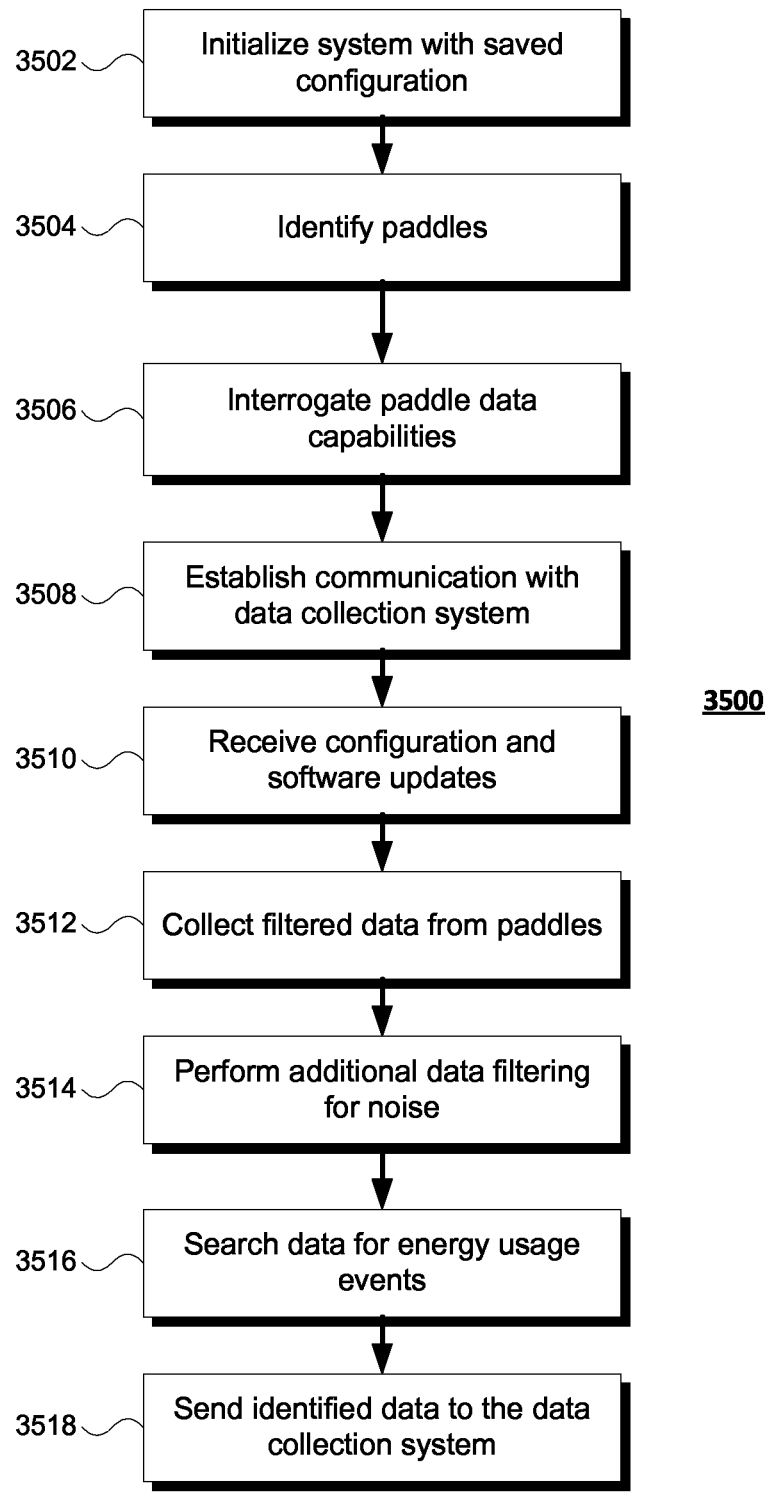
FIG. 35 shows a method of operation of event monitoring system.
Figure 36:
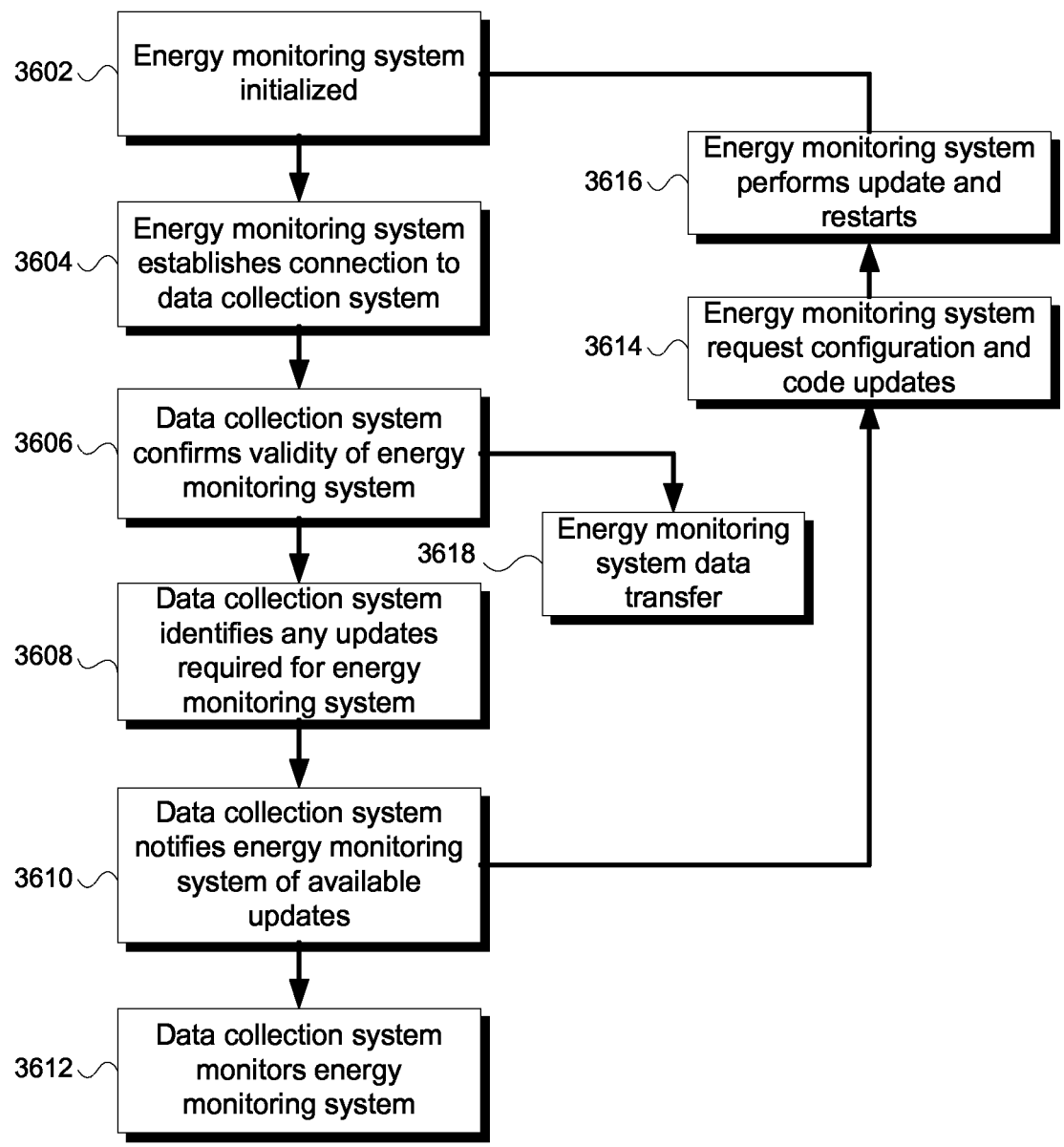
FIG. 36 shows a method flow of communications between energy monitoring system and data collection system.

The software of the energy analysis system resides on both the distributed energy monitoring module hardware and within the different computer systems that collect, process and present the data. FIG. 1 shows the relationships of the various system components while FIG. 32 outlines the method flow of the overall system, FIG. 35 shows the method flow of the energy monitoring system and FIG. 36 shows the method flow for communications within the energy analysis system.

The energy analysis system 10 communicates with, monitors and receives the data from the various energy monitoring systems 4 installed in different premises 2 through one or more networks 1. The energy analysis system 10 also collects data from other relevant information sources on the Internet to be used in the analysis of consumption data and usage patterns. This is accomplished with two pieces of software running stored in memory 192 executed on processor 190 of the energy analysis system 10. The functions of the energy analysis system 10 can be provided by modules namely the raw data collector 110 and the related data collector 120 with data stored in the data storage system 9. Multiple instances of the data collection system may be present in an implementation. The function of the energy analysis system 10 may be distributed across multiple computers or provided by a single processing device. The method of communication flow in FIG. 36 outlines a communication method between the energy monitoring system 4 and the energy analysis system 10.

The energy monitoring system 4 comprises a processor 101 and memory 102 coupled to a communication module 103 or communication interlace. The memory 102 contains modules for collecting consumption information via paddle modules 61 from circuit breakers in a breaker panel 21, or from an integrated circuit monitoring system. When the energy monitoring system 4 is installed as per the method flow outlined in FIG. 33 and activated on premises, the processor 101 will communicate using the communication module 103 to send relevant data about the energy consumption and usage patterns at that premises to the raw data collector 110. The raw data collector 110 will uncompress the data, condition the data and fix errors in the data where possible. The raw data collector 110 will also extract common mode signals that can arise from sensor data that came from adjacent breakers. It does this both to correct the signal and to remove spurious errors that may occur on single channel data. It will then save this information to the data storage system 9 for subsequent processing by other components of the energy analysis system 10.

The raw data collector 110 component of the data collection system may also monitor whether the communication module 103 for each energy monitoring system 4 is accessible and functioning in order to report any loss of communication or power to a specific site being monitored. The raw data collector 110 may communicate with these remote communication modules 103 using a number of different Internet and proprietary protocols. The protocols used between the data collector and the communication module may change over time as more effective protocols are found and when the needs of the energy analysis system change. The communication module 103 may utilize wired or wireless network interlaces to communicate through one or more networks to the energy analysis system 10.

The other component of the energy monitoring system 10 is the related data collector 120 which collects or queries information from other Internet sources that have data such as temperature, time zone, and geographical location of Internet Protocol (IP) addresses, network failure information and weather among other pieces of data. The data collection system makes this data available for subsequent analysis by the analysis module. The additional related data may be utilized in analyzing the collected consumption data and aid in determining events or consumption changes form the data.

An analysis module 140 of the energy analysis system 10 processes the large volumes of raw energy usage data saved to the data storage system 9. The primary software components of the analysis module, as shown in FIG. 1 consist of the data storage system 9, the event detector 130, the event analyzer 160, the data analyzer 150, and the recommender engine 170.

Within the energy analysis system 10, an event is defined as some form of energy usage either caused by human actions or by devices that consume energy on some approximately regular schedule. Some events are considered ongoing and predictable while others may be less frequent with a shorter duration and are more random in nature.

The data storage system 9 consists of software and hardware enabling distributed storage of at least petabytes of collected data over a number of different computers such that the data can be accessed and updated by different analysis modules that are potentially located at different physical locations. The data storage system 9 stores the data in a redundant manner in order to prevent loss of data in the event of storage media failure. The data storage system 9 may be implemented in a distributed manner over several physical nodes with different applications interacting with it.

The event detector 130 identifies when energy is being consumed on one or more circuits. Different versions of the event detector 130 may exist on energy analysis system 10 and energy monitoring systems 4 as shown as event detector 107. The event detectors 130 and 107 perform signal processing and analysis in order to identify when devices start, alter or end their energy consumption. The event detector 130 and 107 may involve signal conditioning, filtering and monitoring of the energy usage signal with the key goal being elimination of low value data. The event detector 107 may perform pre-processing to determine relevant events for processing by event detector 130 of the energy analysis system 10

The data analyzer 150 extracts relevant details from raw data stored in the data storage system 9. For a series of data points, it may find the best fit for the data to an equation, pull out maximum and minimum values or calculate variance among other activities that it performs. The extracted data is then saved in the data storage system for subsequent use by the event analyzer 160.

The event analyzer 160 identifies similarities and differences between events in order to determine when devices or types of devices are consuming energy. The event analyzer 160 examines relationships between events, between events and non-event data from other sources, differences in the same type of event between sources and differences in the same type of event from the same source over time. The event analyzer 160 uses the parameters extracted from the raw data by the data analyzer and data analytics to statistically seek patterns in the data. The software also uses learning algorithms to improve its understanding of different events as the amount of saved data increases.

The higher level data generated from event analysis 140 is saved in the data storage system 9 such that it can be used by the recommender engine 170 and presenter systems 180.

The recommender engine 170 generates recommended actions that can be taken in order to benefit energy suppliers, consumers and other interested parties based on the energy utilization and patterns of energy use. The recommender engine 170 looks for patterns in the event analysis data that satisfy certain heuristic rules and when such conditions are met generates a recommendation for the corresponding action. The exact nature of the generated recommendations will depend on the service being provided but are based on finding data relationships from the results of signal, event and external information analysis.

With many options for analysis, the types of recommendations generated by the recommender engine can vary significantly. A simple recommendation could be generated to shut off a stovetop burner, to check the operation of a piece of equipment or to check on the energy monitoring system itself. A more complex recommendation could identify the need to service a piece of equipment. An even more complex recommendation could suggest options for the replacement of a piece of existing equipment and could identify specific dollar savings for each option. A collection of such recommendations with dollar savings could feed into a complete report comparing energy consumption of a premises against others in the same demographic to assist in identifying opportunities for making improvements.

The recommended actions that are generated by the software are stored to the data storage system and may also be communicated toward humans through various communications media via the presenter system. Likewise, the recommendations can also be machine to machine in nature with the recommender engine directing its recommendations to other publication or monitoring and control systems via different Internet or proprietary protocols.

The presenter system 180 facilitates presentation of recommended actions generated by the recommender engine 170 to be communicated to different recommendation consumers 3 via different communication technologies and in different formats such as email, messaging, telephone, mobile applications and online reports. The presenter system 180 extracts recommended actions from the data storage system 9 and processes before directing them to the appropriate audience. The presenter system 180 may also communicate with other components over the network 1 to provide recommendations to these applications and devices so that they can initiate action by using the information. The presenter system 180 may consist of numerous physical nodes.

With the large number of possible recommendations that can be generated by the energy analysis system 10, the recommender engine 170 and presenter system 180 together provide the ability to filter which recommendations are delivered. Depending on the specific service being offered to give recommendation consumers, the recipient may be able to set the filter specifications and there thereby control the types of recommendations that would be received. Once the preferences are set, the recommendation consumer would only receive recommendations matching the categories indicated.

Figure 2:
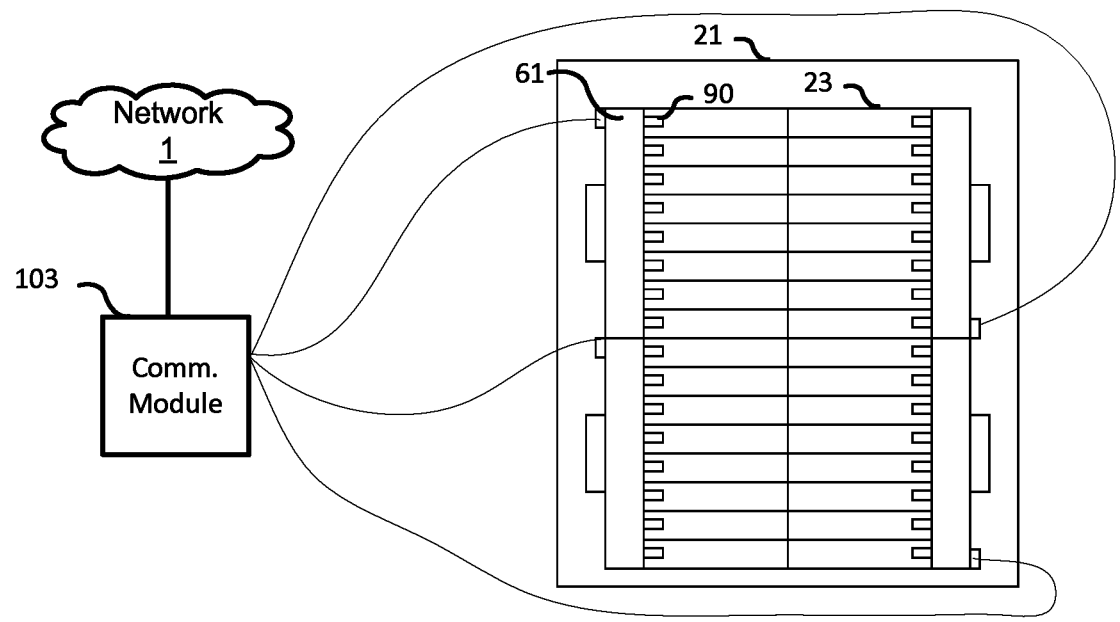
FIG. 2 is a block diagram of the energy monitoring module.

Generated recommendations may be directed toward energy consumers and devices capable of taking action from the recommendations and the operators of the energy analysis system itself. Some of the devices and systems that could make use of recommendations include smart appliances, the smart grid, demand side or demand response management systems as well as security, people and equipment monitoring systems. The hardware installed on monitored sites as well as the software that is runs is called the energy monitoring system 4 as shown in FIG. 2.

Figure 33:
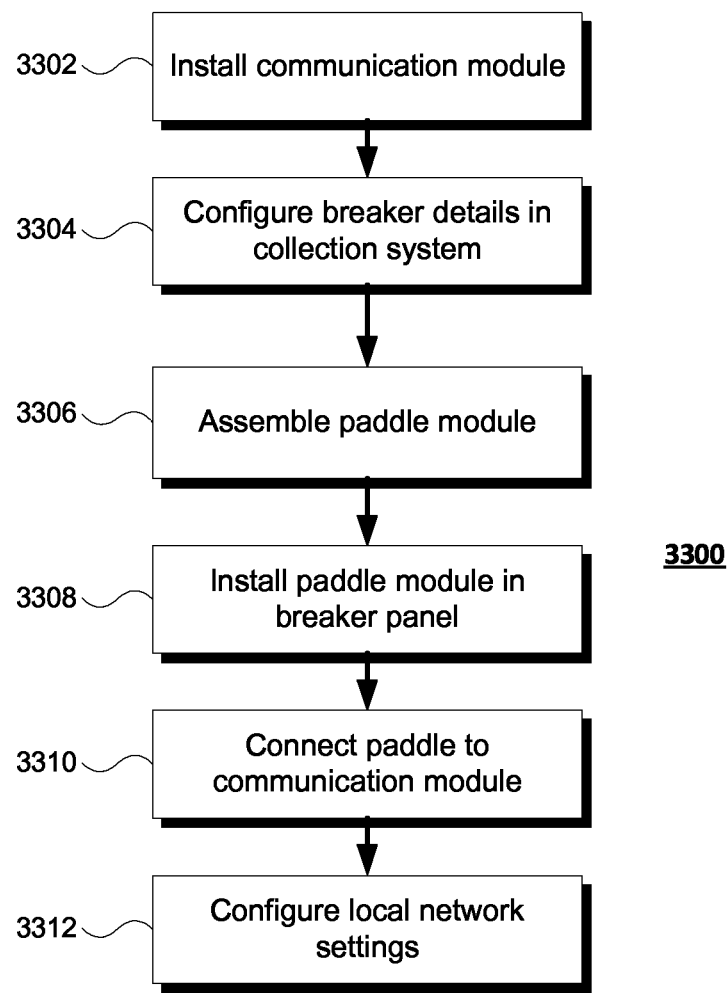
FIG. 33 shows a method flow of energy monitoring system installation.

The energy monitoring system 4 is installed on the premises to be monitored, as outlined in the method flow of FIG. 33, in order to collect data from the premises and report on the status of the system at the site. The modules stored in memory 102 for providing function of the energy monitoring system 4 are the signal analyzer 105, the signal filter 106, the event detector 107 and the data compressor 108. The processing functions of the energy monitoring system 4 can be provided on the embedded computing hardware or discrete processing components. The signal analyzer 105 controls the quality of the sampled data signal and to identify persistent sources of noise and persistent corruption in the data. The signal filter 106 improves the quality of the measured data signal by removing noise and any signal drift. The event detector 107 identifies when events are occurring on the premises in order to limit the volume of data sent over the network to the data collection system 4. However, event data is not the only data sent to the data collection system and periodically, raw data may also be sent. The data compressor 108 reduces the number of bytes required to represent the captured data in order to reduce the bandwidth consumption of the energy monitoring system 4.

The communication module 103 connects to the energy analysis system 10 to transmit energy usage measurements for subsequent processing in order to identify energy usage events. One or more paddle modules 61 communicate with and may be plugged into the communication module 103 to collect such energy usage measurements. The sensor module casing 91 of the sensor module 90 that plugs into the paddle modules matches the specifications for each circuit breaker 21. The paddle modules are designed to be customizable on site to allow different combinations of sensor modules to be connected to the paddles as will be further described. The modularity of paddle modules and paddle sensor modules allows connection and measurement for any type of circuit breaker in any configuration of breaker panel. It is expected that the assembly of these paddles may be performed on site to account for the variability in layout of breaker configurations.

The communication module 103 establishes and maintains communication with both the energy analysis system 10 over the network and the individual sensor paddles. Once initialized, the communication module may communicate with the network, as per the flow in FIG. 36, using either wired or wireless communication. The communication module 103 also provides the ability to configure the energy monitoring system 4 with information needed during initialization and also checks the status of the system and isolates operating problems using standard Internet technologies such as SSH, HTTP, Telnet, FTP and other proprietary protocols for communication with the module. The communication module also watches for update notifications from the energy analysis system 10.

With respect to wireless communications, the communication module can be implemented using, but not limited to, Wi-Fi™, Bluetooth™, Zigbee™, 3G™, 4G™ for wireless communications. For wired communications, the communications module can be implemented using power line communications, Ethernet, telephone modem or any of the emerging Smart Grid communications protocols as needed. The communication module may alternatively communicate through a gateway device or home automation device to send and receive data with the energy analysis system 10.

Figure 3:
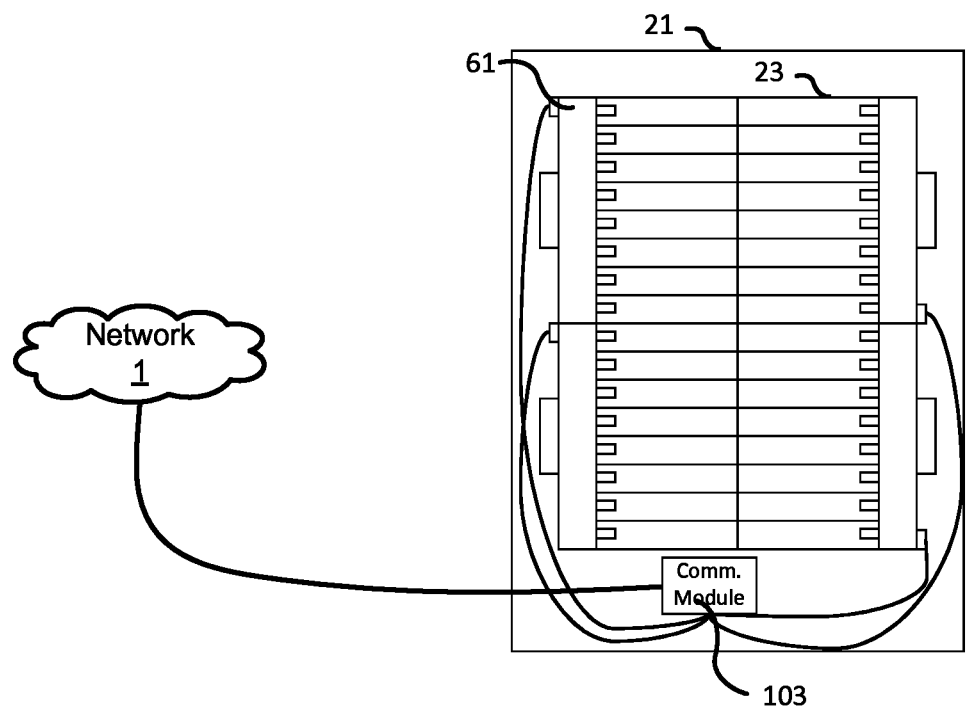
FIG. 3 is a block diagram of the communication module.

The communication module 103 is installed in proximity to the paddle modules but does not need to be collocated with them in the panel. If desirable, the communication module may be placed external to the panel with wires directed into the panel or may use wireless technologies for communication with the paddle. FIGS. 2 and 3 show the possible options for placing the communication module 103 relative to the paddle modules 61 with respect to the breaker panel 21. In FIG. 2, the communication module is located external to the breaker panel, but in FIG. 3, the communication module is located within the breaker panel 61.

With regard to the connection to power, the communication module 103 supports three different connection formats that affect the packaging of the communication module.

In one form, the communication module electronics is placed in a standard electronic enclosure and is connected to a standard AC plug. The communication module will have an internal AC to DC converter that connects to an AC power cord and to the AC plug. This allows the communication module to be placed inside or outside the breaker while the AC plug is outside the breaker.

In the second form, the communication module electronics is also placed in a standard electronic enclosure, but is connected to a DC adapter that itself plugs into a standard AC plug. This allows the communication module to be placed inside or outside the breaker while the AC to DC adapter is placed outside the breaker.

Figure 4:
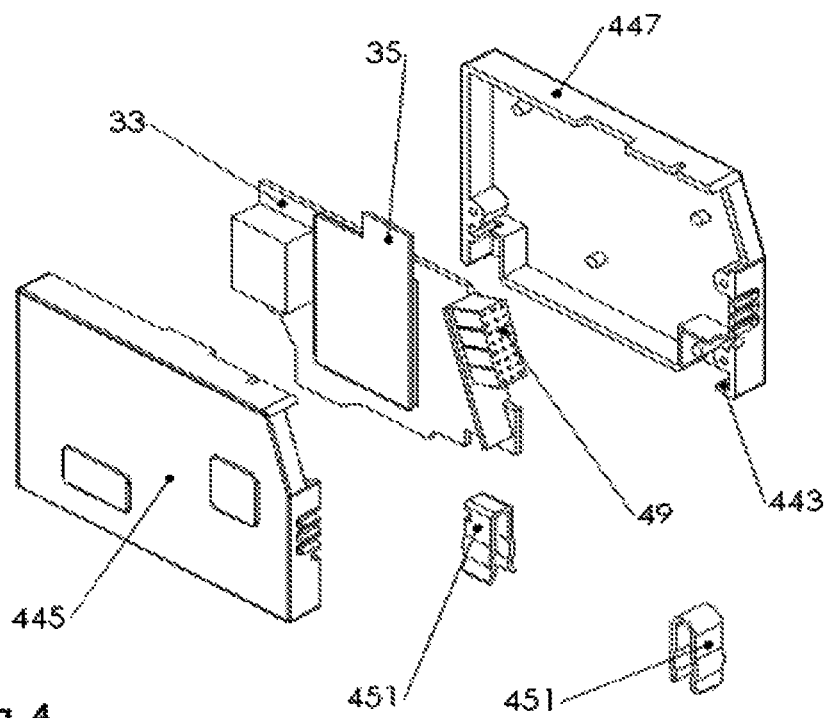
FIG. 4 is an exploded perspective view of a communication module.

In its third form, as shown in exploded view in FIG. 4, the communication module electronics 33 is contained within an enclosure 445 and 447 having an external form factor that allows the module to be placed within a breaker slot in a breaker panel. The exact means of connection varies by breaker panel vendor, but generally uses spring force and some form of plastic registration tab 443 to hold the communication module in place. The electrical connectors 451 on the communication module enclosure match those required by the breaker panel allowing the communication module to obtain power directly from the panel.

This format for the communication module 103 prevents the need for external power wiring from an AC plug outside the panel to the communication module back inside the panel. This also allows the communication module 103 to fit into space-constrained breaker panels where there is little space except for wiring and breaker panels. Examples of the communication module 103 made to fit breakers from companies such as Cutler-Hammer™, Federal Pioneer™, Siemens™, Square D™ and DZ47™ are shown in FIGS. 5 through 9.

When the communication module 103 is packaged within a breaker-like case such that it can be placed in a breaker panel, the form factor of the communication module 103 case may be similar to the form factor of actual breakers in the panel. This means that for each breaker panel vendor, there may be a specific type of case. That said, generally the breaker-like cases will be composed of two enclosure halves 445, 545, 645, 745, 845, 945 and 447, 547, 647, 747, 847, 947 that have registration indentations and protrusions 543, 643, 743, 843, 943 and electrical hardware 451 to connect to the electricity distribution structure within the breaker panel. The cases may also have an exposed header 49 to allow connection to the paddle modules as well as an exposed antenna 35 when the communication module 103 connects wirelessly to the network. The communication module 103 may also expose LED indicators 37 from the internal circuitry in order to communicate information about the health of the unit and the connection to the network 1.

Figure 5:
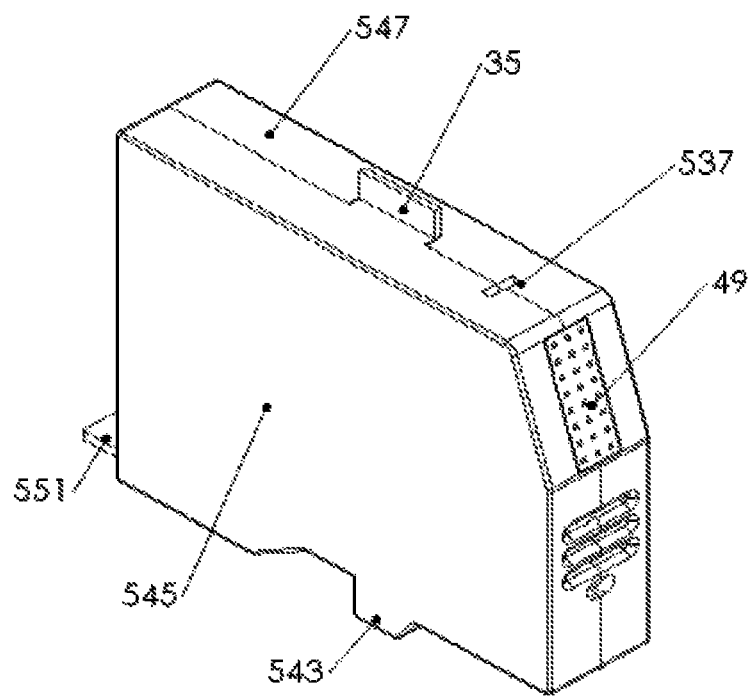
FIG. 5 is a perspective view of the communication module with a Cutler Hammer™ circuit breaker compatible form factor.

FIG. 5 show a communication module for a Cutler Hammer™ breaker panel having right side enclosure half 545 and left side enclosure half 547, LED indicator 537 and electrical hardware 551.

Figure 6:
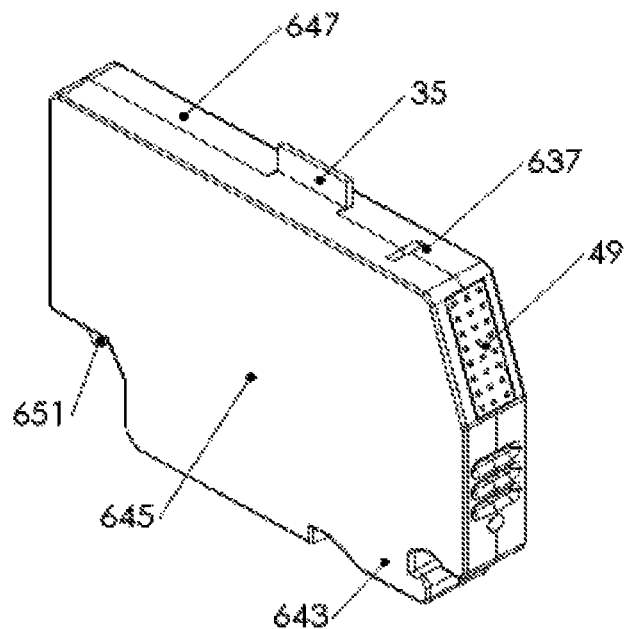
FIG. 6 is a perspective view of the communication module with a Federal Pioneer™ circuit breaker compatible form factor.

FIG. 6 show a communication module for a Federal Pioneer™ breaker panel having right side enclosure half 645 and left side enclosure half 647, LED indicator 637 and electrical hardware 651.

Figure 7:
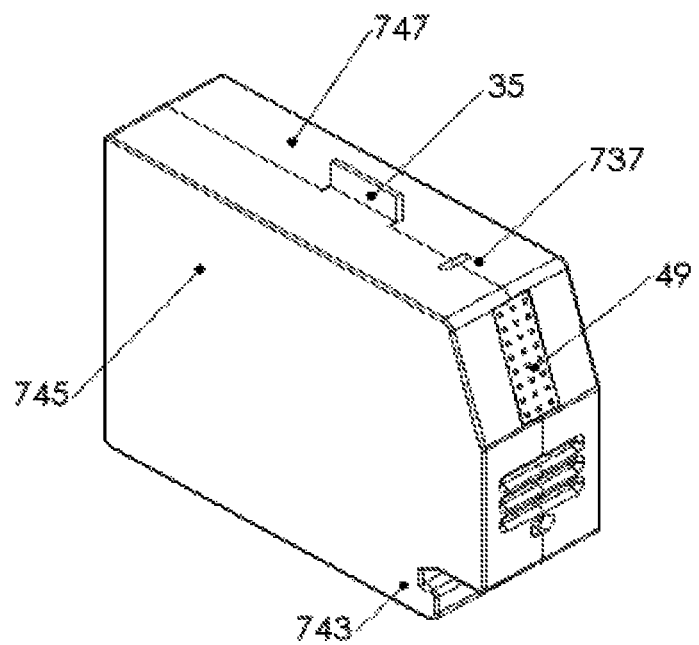
FIG. 7 is a perspective view of the communication module with a Siemens™ circuit breaker compatible form factor.

FIG. 7 show a communication module for both the Siemens™ and Eaton™ breaker panels having right side enclosure half 745 and left side enclosure half 747, LED indicator 737 and electrical hardware 751.

Figure 8:
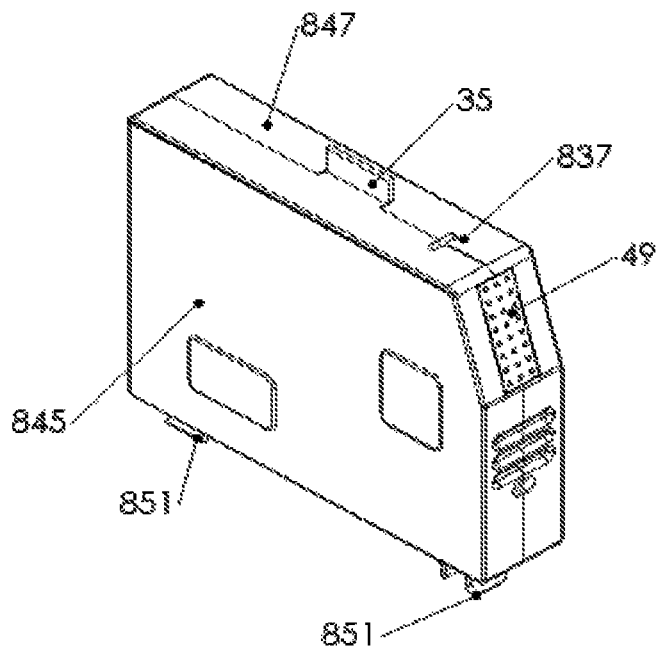
FIG. 8 is a perspective view of the communication module with a Square D™ circuit breaker compatible form factor.

FIG. 8 show a communication module for a Square D™ breaker panel having right side enclosure half 845 and left side enclosure half 847, LED indicator 837 and electrical hardware 851.

Figure 9:
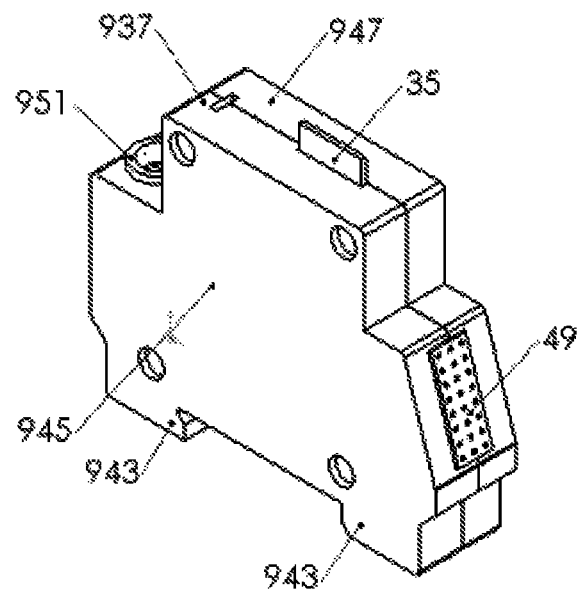
FIG. 9 is a perspective view of the communication module with a DZ47™ circuit breaker compatible form factor.

FIG. 9 show a communication module for a DZ47™ breaker panel having right side enclosure half 945 and left side enclosure half 947, LED indicator 937 and electrical hardware 951.

Figure 10:
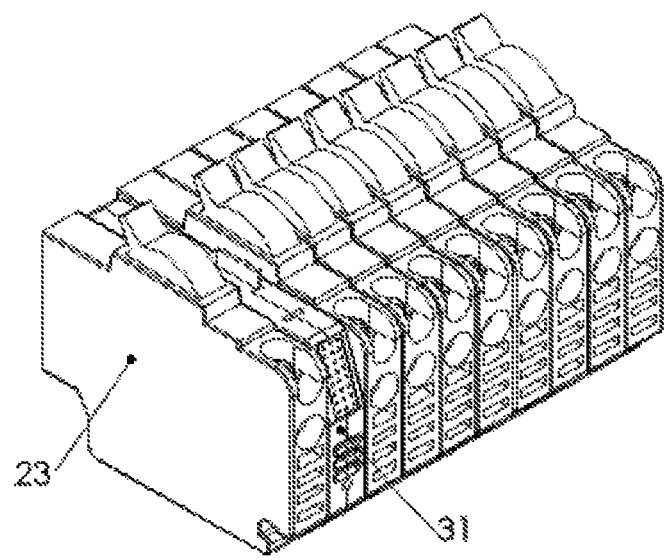
FIG. 10 is a perspective view of a communication module within a breaker panel.

For the first two forms of the communication module 103, the location of the module may be inside or external to the breaker panel 61 as outlined in FIGS. 2 and 3 and power will come from external to the breaker. For the last format, the communication module will not connect with an AC plug because it is intended to draw its power directly when placed in a slot within the breaker panel. It will, however, connect to both the hot and the neutral wires of the electrical bus, using a code approved method and will require the main breaker power to be disconnected and reconnected during installation. FIG. 10 shows an example of a breaker-like communication module 103 placed alongside circuit breakers 23 as they would be placed within a breaker panel.

Figure 11:
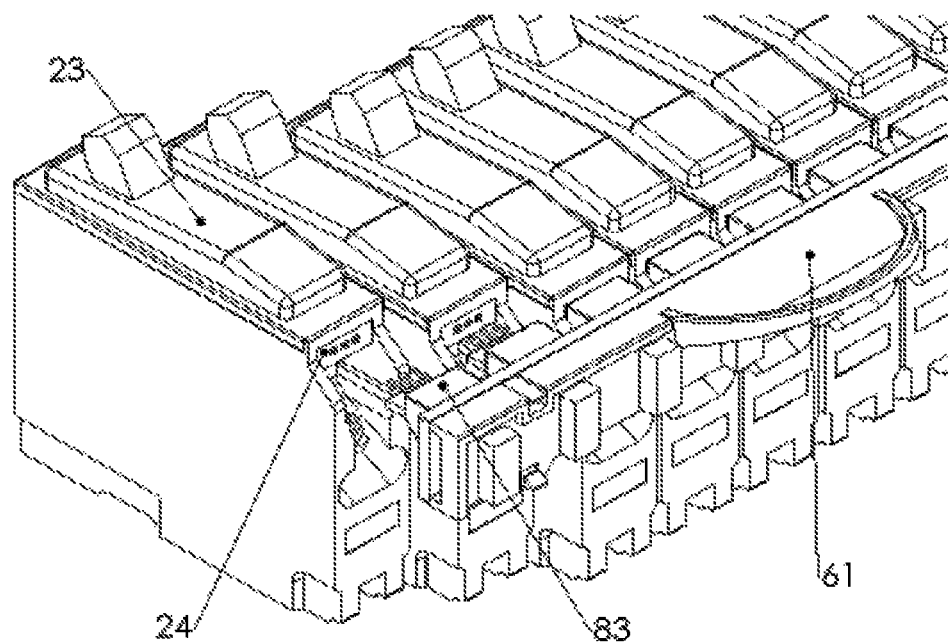
FIG. 11 is a perspective view of a set of circuit breakers with built in current sensors.
Figure 12:
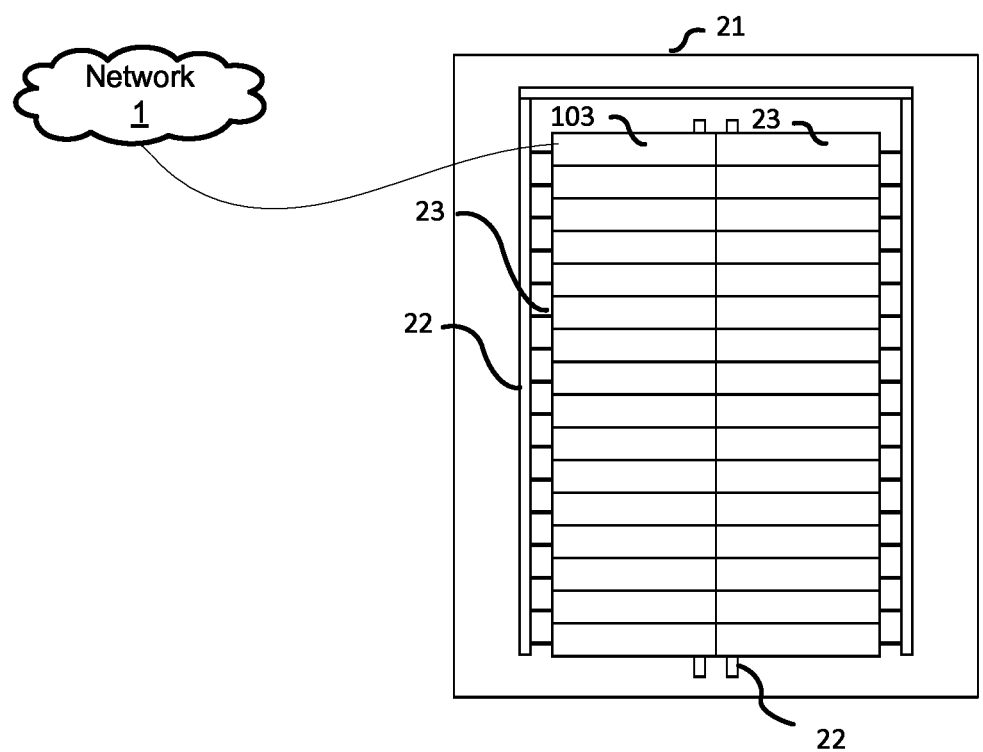
FIG. 12 is a block diagram of a breaker panel with circuit breakers having the current sensor, signal processing and communication circuitry embedded.

For new breaker installations, an alternative to the paddles 61 and sensors modules is to install a breaker manufactured with the current sensor built in, as shown in FIG. 11. The sensor information can be transmitted directly via the sensor header 24 on the circuit breaker and the sensor connector 83 on the paddle module to the paddle module 61 electronics for processing. The information collected by the paddle 61 can then subsequently be transmitted to a communication module 103. Alternatively, as shown in FIG. 12, the sensor signal can be processed directly by electronics contained within the breaker 23 before being transmitted to a communication module 103 over the existing electrical bus 22 of the breaker panel 21. This option may also make use of a breaker-like communication module 103 installed in the panel 61. For both of these options, the need for separate sensor modules is eliminated.

Figure 13:
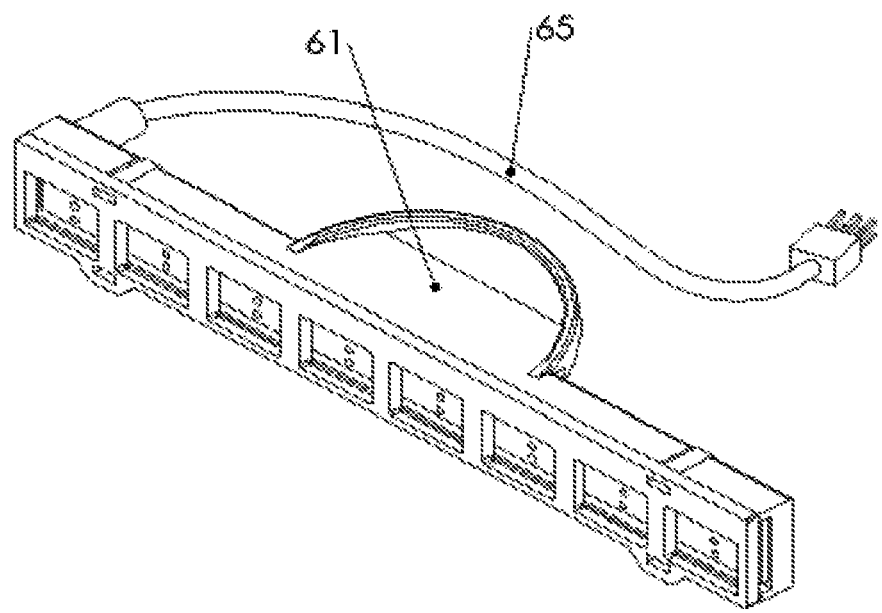
FIG. 13 is a perspective view of an assembled paddle module without sensors and with the paddle module plug.
Figure 14:
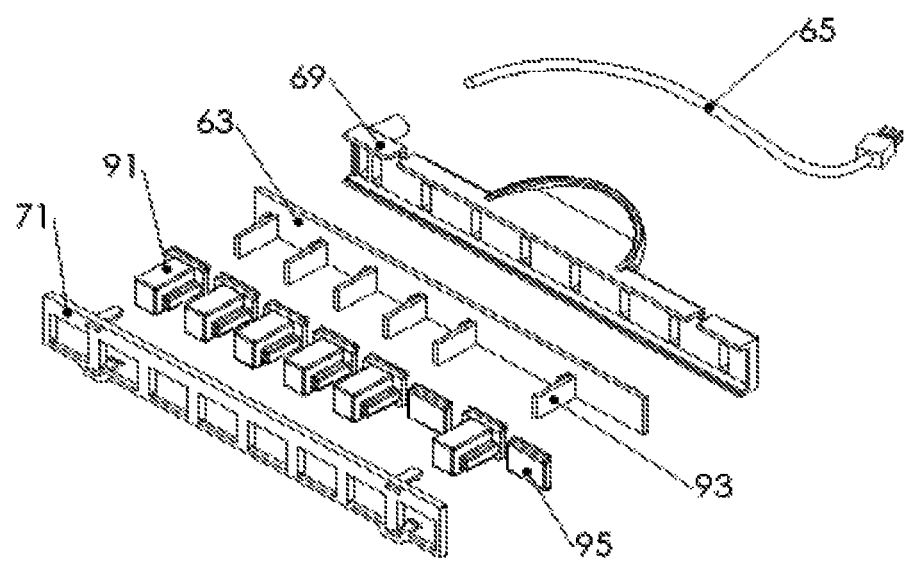
FIG. 14 is an exploded perspective view of a paddle module.

The paddle module 61, shown without sensors in FIG. 13 and in exploded view with sensors in FIG. 14, consists of the electronics 63 and the electronics enclosure 69 and 71 that allows multiple sensor module casings 91, blank sensor casings 95 and sensor electronics 93 to be grouped together. If a wired connection is used, then the paddle module will have a connector wire 65 to attach to the communication module. The paddle module 61 provides the capability for the measurements from the sensors 93 to be processed and transferred to the communication module 103.

The primary role of the paddle modules is to collect measurements from the individual sensor modules 90 and communicate these measurements to the communication module 103. The paddle modules 61 may also perform some data analysis, compression and filtering in order to reduce the amount of data sent to the communication module and subsequently to the energy analysis modules. The effort performed by the paddle modules 61 can also reduce the processing requirements of the communication module 103. The paddle modules 61 may communicate with the communication module 103 through a wired or wireless connection.

Figure 15:
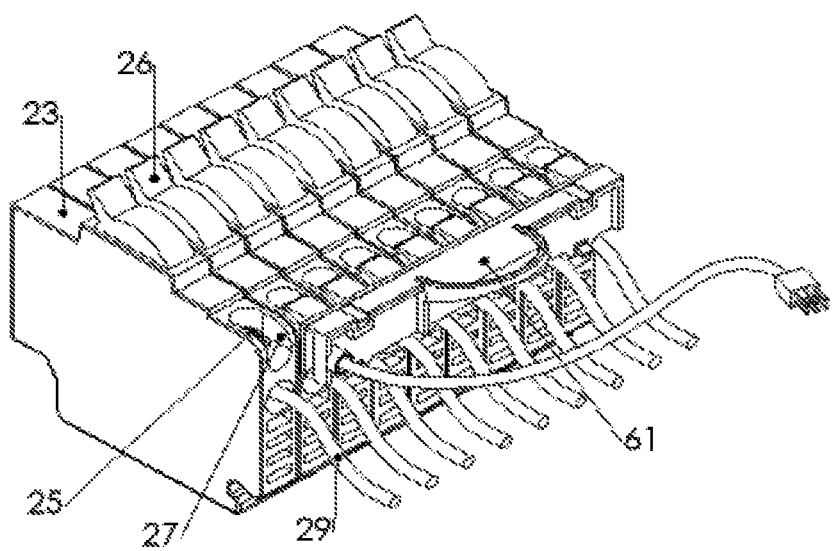
FIG. 15 is a perspective view of a bank of circuit breakers showing the placement of an installed paddle module.

When installed in the breaker panel 21, as per FIG. 33, paddle modules 61 are located adjacent to the circuit breakers 23 in a manner that allows the individual sensor modules to affix to individual breakers 23 such that there is consistent placement of the sensors relative to the breakers 23. FIG. 15 shows this for a paddle module 61 attached to a series of circuit breakers 23. The paddle modules 61 are sized to avoid interfering with either the wire attachment screw 25 or the electrical wiring 27 that connects to a circuit breaker 23. The placement of the paddle module 61 away from the circuit breaker switch 26 also ensures that there is no interference with the operation of the circuit breaker in protecting against fault conditions.

Figure 16:
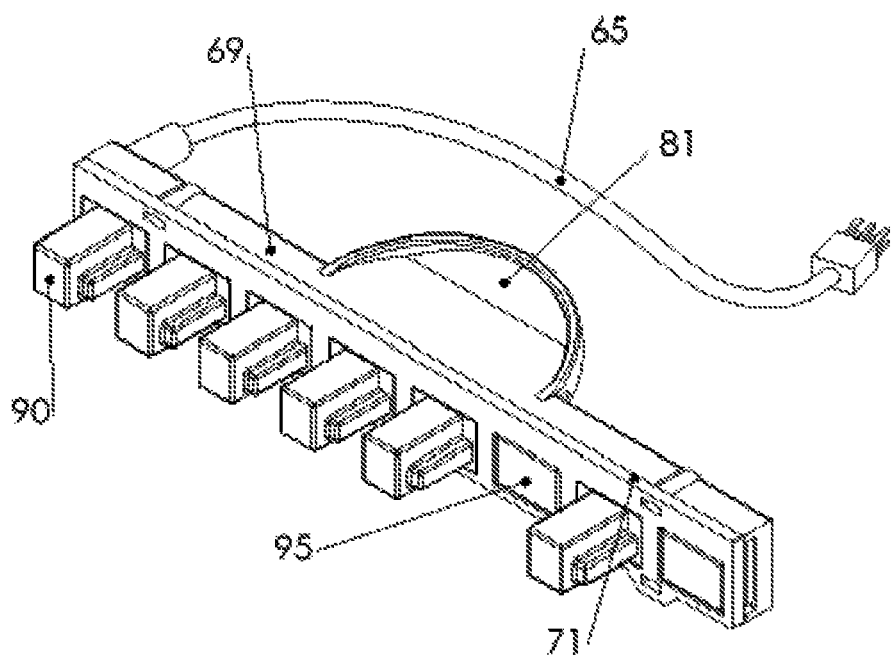
FIG. 16 is a perspective view of an assembled paddle module with sensors.
Figure 17:
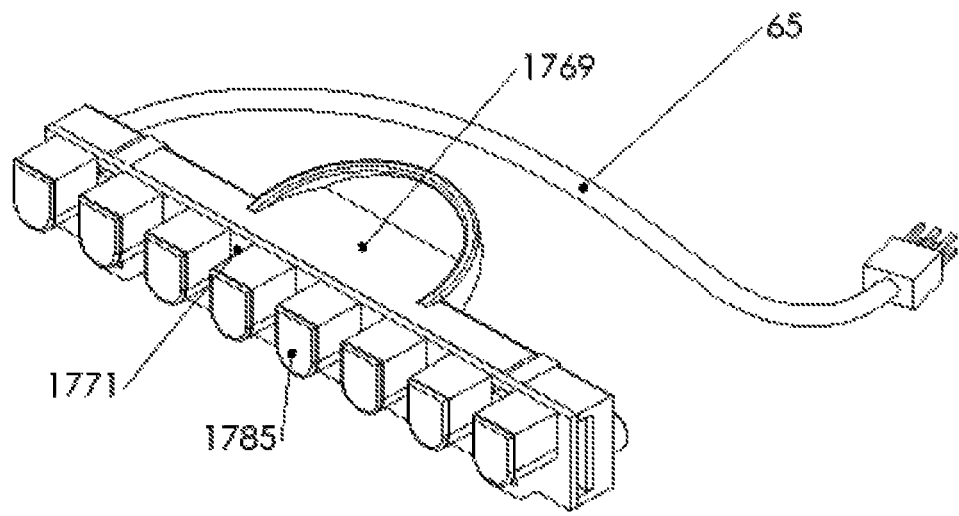
FIG. 17 is a perspective view of an assembled paddle module for a type of circuit breaker having only one physical format.

The paddle modules 61 may have one or more sensor modules affixed to them, see FIG. 16, as per the needs of the breaker panel into which the paddle will be installed. In situations where modularity is not required in order to connect to all of the individual breakers in a panel, an integrated sensor module casing may be formed as a part of the paddle module front enclosure. An example of this is shown in FIG. 17. In such situations, the front of the paddle module 1771 case is a single piece comprised of a collection of similar sensor casing shapes 1785 as used in the individual sensor modules in order to enable the paddle module to remain affixed to the circuit breakers. The back casing 1769 of the paddle module need not be changed to accommodate this alternative format of affixing to the circuit breaker.

Figure 18:
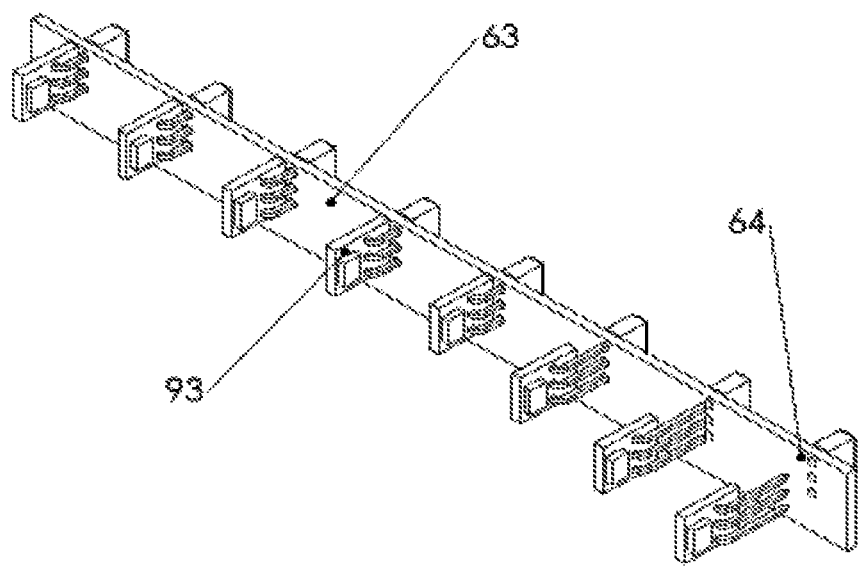
FIG. 18 is a perspective view of the paddle module electronics showing how the sensor module electronics are installed.

The electronic circuit of a paddle module is itself modular, as shown in FIG. 18, such that sensor module electronics 93 may be plugged into the insertion plugs 64 of the paddle module electronics 63 individually to address the breaker configuration at a specific site. This allows different types of energy sensors to be used depending on the needs of the circuit and any site-specific monitoring needs. It also allows combinations of breakers from different vendors to be monitored with a single paddle. Alternatively, combined sensor modules may also be plugged into the paddle circuit board for more rapid paddle module assembly. If no circuit breaker is present or there is no need to monitor a specific breaker, the sensor may also be omitted. This is shown in FIG. 14 where some sensors are not installed.

The different paddle modules 61 are each designed to work with a specific brand of circuit breaker taking into account the dimensions of the circuit breakers produced by a particular vendor. FIGS. 19 through 22 show different examples of the assembled paddle modules that are intended to work with the breakers from different breaker vendors. In some cases, a number of the components of the paddle can be used for breakers from different vendors. For all variations of the paddle modules, however, the enclosure halves for the paddles clip together to form a shell around the electronics.

Figure 19:
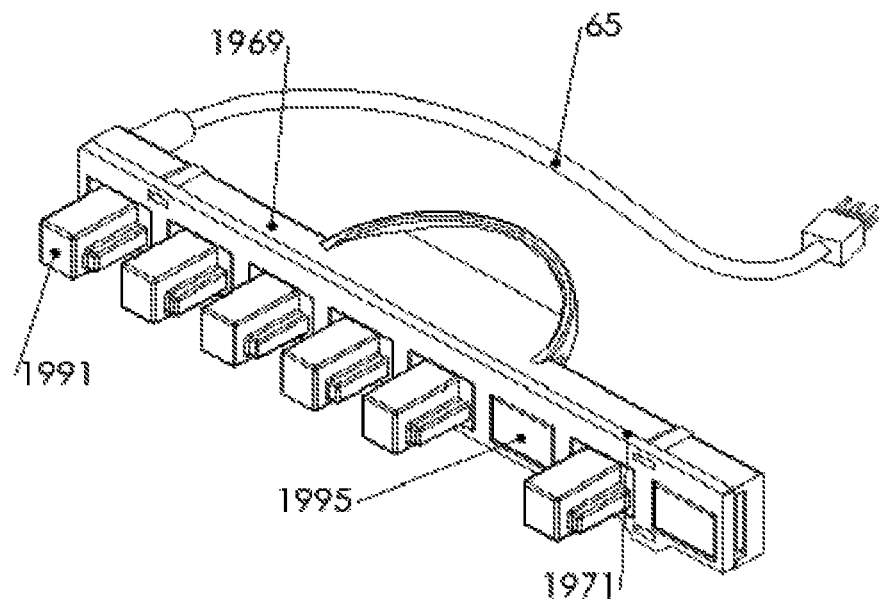
FIG. 19 is a perspective view of an assembled paddle module compatible with some Cutler Hammer™ and Square D™ breaker panels.

FIG. 19 is a perspective view of an assembled paddle module 1969 compatible with some Cutler Hammer™ and Square D™ breaker panels. The front of the paddle module 1971 case is a single piece comprised of a collection of similar sensor casing shapes 1991 as used in the individual sensor modules in order to enable the paddle module to remain affixed to the circuit breakers. A blank or empty module 1995 may be provided when a sensor is not required.

Figure 20:
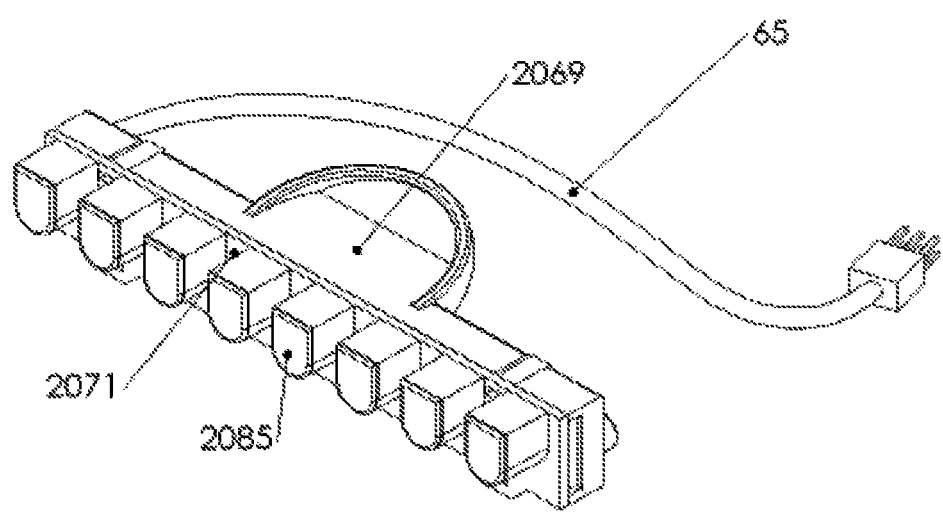
FIG. 20 is a perspective view of an assembled paddle module compatible with Federal Pioneer™ breaker panels.

FIG. 20 is a perspective view of an assembled paddle module 2069 compatible with Federal Pioneer™ breaker panels. The front of the paddle module 2071 case is a single piece comprised of a collection of similar sensor casing shapes 2085 as used in the individual sensor modules in order to enable the paddle module to remain affixed to the circuit breakers.

Figure 21:
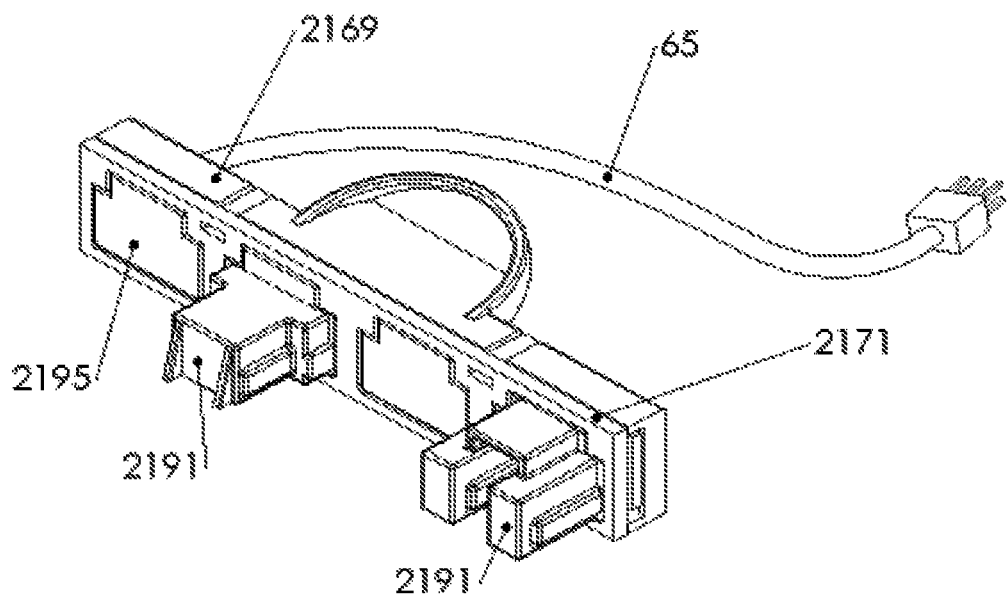
FIG. 21 is a perspective view of an assembled paddle module compatible with Eaton™ and the Siemens™ breaker panels.
Figure 22:
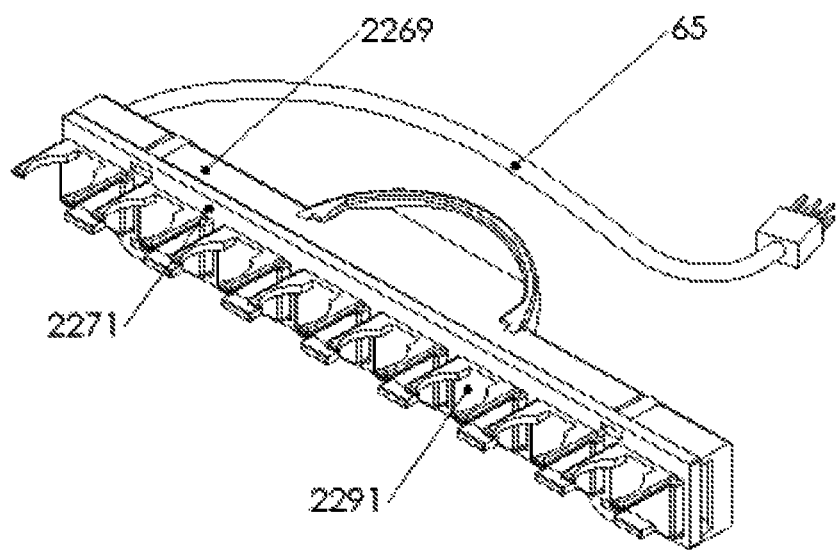
FIG. 22 is a perspective view of an assembled paddle module compatible with DZ47™ circuit breakers.

FIG. 21 is a perspective view of an assembled paddle module 2169 compatible with Eaton™ and the Siemens™ breaker panels. The front of the paddle module 2171 case is a single piece comprised of a collection of similar sensor casing shapes 2191 as used in the individual sensor modules in order to enable the paddle module to remain affixed to the circuit breakers. A blank or empty module 2195 may be provided when a sensor is not required FIG. 22 is a perspective view of an assembled paddle module 2269 compatible with DZ47™ circuit breakers. The front of the paddle module 2271 case is a single piece comprised of a collection of similar sensor casing shapes 2291 as used in the individual sensor modules in order to enable the paddle module to remain affixed to the circuit breakers.

Figure 23:
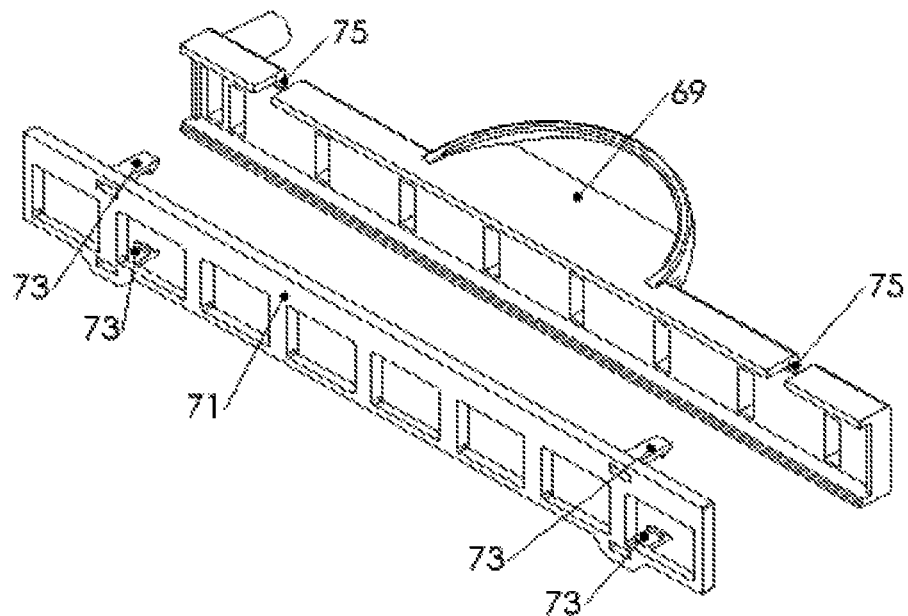
FIG. 23 is a perspective view of the paddle module enclosure halves showing the tabs and tab retainers.

FIG. 23 shows the paddle module enclosure halves 69 and 71 with the paddle module tabs 73 that clip into the paddle module tab retainers 75. The use of exposed tabs means that the enclosure halves may be readily assembled or disassembled without the need for tools. To allow paddles modules to be adapted to each specific circuit breaker, the paddle modules may be assembled on site. FIGS. 24, 25, 26, 27, and method flow FIG. 34 detail the assembly of a paddle.

The paddle module cases are designed to provide electrical isolation between the sensor conditioning circuitry and the exposed AC connectors of the circuit breaker. To ensure safety, the sensor module casing 91 material may be chosen to have high resistance to electrical conduction and to be a fire retardant material. As well, the paddle modules each have a handle 81 on them, as shown in FIG. 16, that allows placement of the paddle module and attached sensor modules 90 without the need to touch any circuit breaker with the hands of the installer. The sensor module 90 consists of one or more sensor electronic boards and the sensor casing that attaches to a paddle module using the paddle module enclosure.

Figure 28:
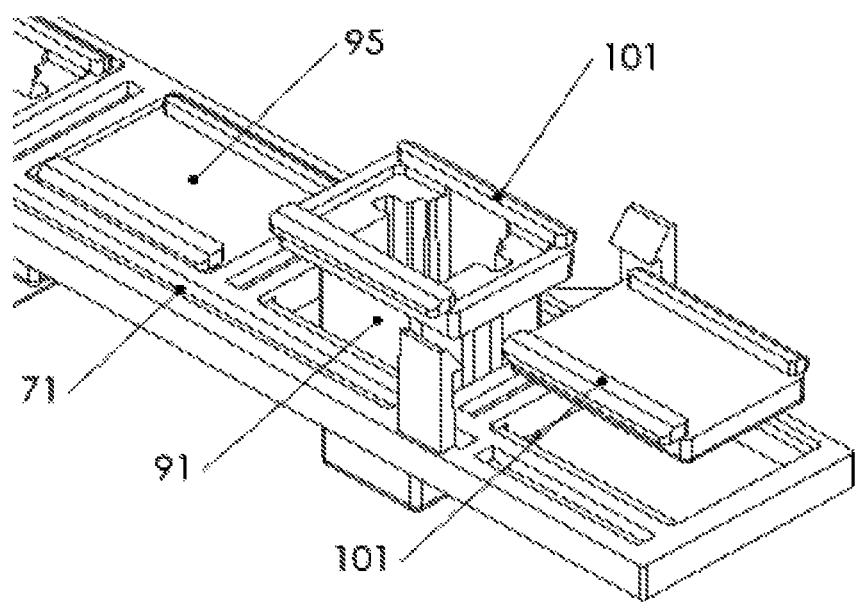
FIG. 28 is a close up perspective view showing the sensor module retention tabs.

Each sensor module is attached to the paddle module such that once the paddle module enclosure is assembled; the sensor module is locked in place. Only by disassembling the paddle module enclosure can sensor modules be added, removed or replaced. FIG. 28 shows how the sensor casing retention tabs 101 will restrain the sensor casing 91 and blank casing 95 from coming out of the paddle enclosure front half 71 once the paddle module is assembled.

Figure 29:
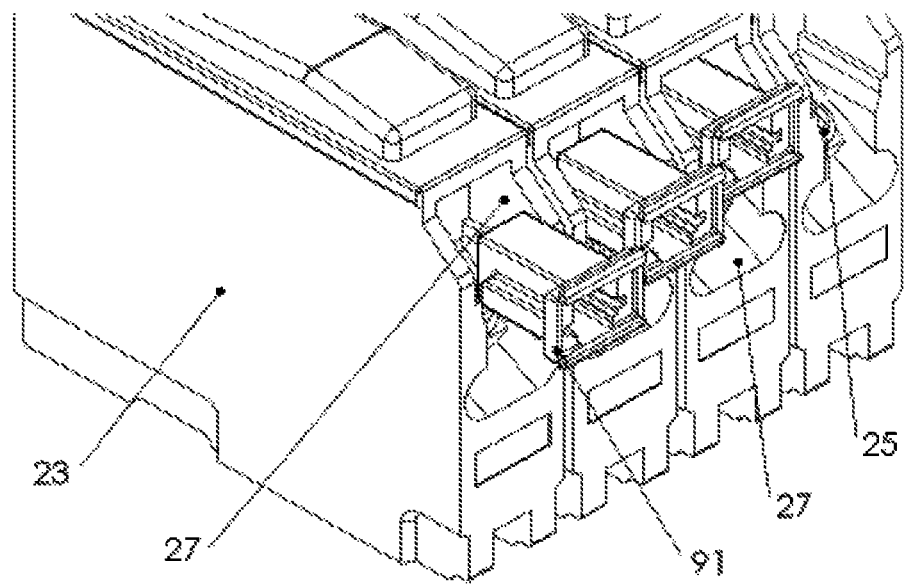
FIG. 29 is a close up perspective view showing the sensor module casings fitting into the circuit breaker screw well.

As seen in FIG. 29, when the screw well 27 of the circuit breaker 23 is accessible for sensor module placement, the casing shapes of the sensors match the shape of the screw wells and the sensor module casings 91 affix to the circuit breakers 23 through friction and force on the breaker screw well walls. The sensors within the casings are consequently located within proximity to the wire attachment screw 25 to allow for detection of the current running through that screw. A rounded front on some of the sensor casings also assists in registering the sensor module casing relative to each circuit breaker by aligning each sensor with a specific screw well. Note that in FIG. 29, the paddle module is not shown.

Figure 30:
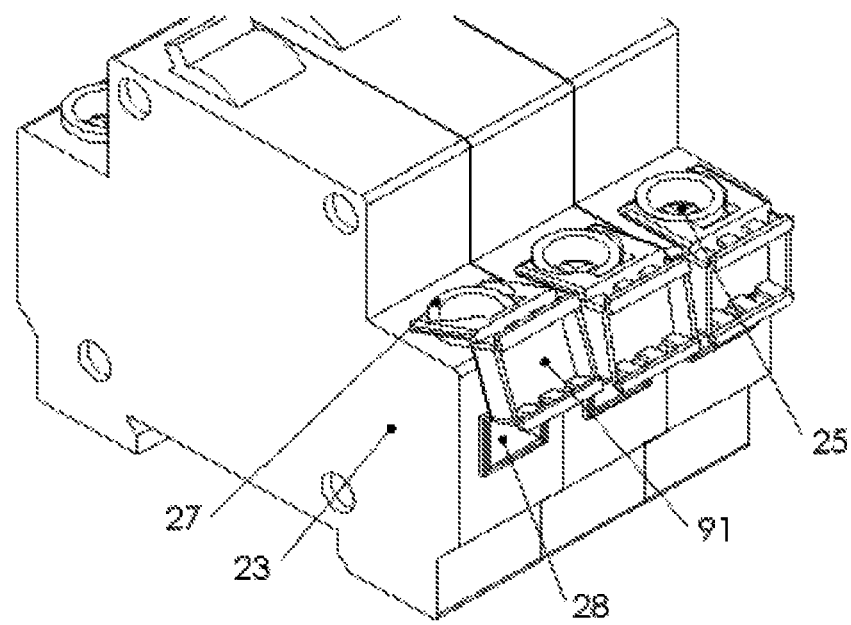
FIG. 30 is a close up perspective view showing the sensor module casings attaching to the circuit breaker screw well and indentations.

In situations where the screw well is not accessible for sensor placement, as in FIG. 30, the sensor modules casings 91 are instead compatible with both the screw well 27 and indentations 28 on the circuit breaker 23 in order to affix the paddle to one or more circuit breakers. For this arrangement, the sensors themselves are located adjacent to where the electrical wire 29 comes into the circuit breaker. Note that in FIG. 30, the paddle module is not shown.

The variations of the sensor module casings are each designed to attach to a specific brand of circuit breaker module of a specific current rating. The shape of each sensor module casing ensures consistent registration of the sensor module casing with respect to the corresponding circuit breaker. This consequently results in consistent registration of the current sensor relative to the circuit breaker in order to obtain consistent measurements.

The outside of the various sensor casings 91 may have one or more sensor module registration/alignment protrusions 97 on them that are intended to enable consistent placement in every installation. Other adhesion/retention protrusions 99 may also be present to serve in helping to affix the sensor module casing to the circuit breaker. Some examples of these different types of sensors modules with different protrusions used for different circuit breakers are identified in FIG. 31 as items 3110 to 3117. Like the external format of the sensor casings, the internal dimensions of each sensor casing also ensure that each sensor sits at the correct position within the screw well or on the side of the breaker to ensure consistent measurements. This is achieved by the sensor casing pushing the sensor to the appropriate depth as the paddle is assembled.

Figure 31:
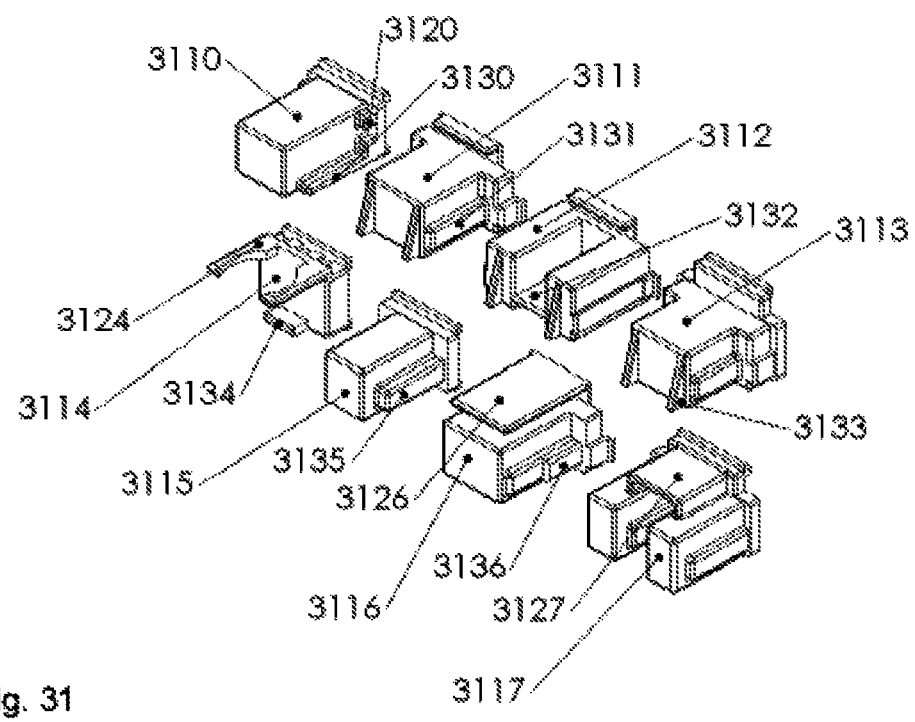
FIG. 31 is a perspective view of different sensor module casings showing the sensor module registration/alignment protrusions and the adhesion/retention protrusions.

The example sensor casings from FIG. 31 are detailed here. Sensor casing 3110 with registration protrusion 3120 and retention protrusion 3130 is for use with a Cutler Hammer™ circuit breaker. Sensor casing 3111 with registration and retention protrusion 3131 is for use with a Siemens/Eaton™ 15 amp circuit breaker. Sensor casing 3112 with registration and retention protrusion 3132 is for use with a high-density dual circuit Siemens/Eaton™ 15 amp circuit breaker. Sensor casing 3113 with registration and retention protrusion 3133 is for use with a Siemens/Eaton™ 40 amp circuit breaker. Sensor casing 3114 with registration protrusion 3134 and retention protrusion 3124 is for use with a DZ47™ circuit breaker. Sensor casing 3115 with registration and retention protrusion 3135 is for use with a SquareD™ circuit breaker. Sensor casing 3116 with registration protrusion 3126 and retention protrusion 3136 is for use with a Siemens/Eaton™ low-density circuit breaker when the breaker is in a vertical configuration. Sensor casing 3117 with registration protrusion 3127 and retention protrusion 3137 is for use with some varieties of the Eaton™ high-density circuit breaker. These sensor casings are to be considered as examples only with numerous variations possible per brand.

Because the sensor module casings can be selected as required, a paddle module can be assembled to connect to breakers from different vendors when these breakers are able to reside within the same breaker panel.

The sensor module casings are designed to provide electrical isolation between the sensor and the exposed AC connectors of the circuit breaker within which the sensor is placed in close proximity. Generally, the registration of the sensor modules will be such that it avoids contact with any metal within the breaker, but this is not always possible depending on the design of the breaker. To ensure safety, the sensor module casing material may be chosen to have high resistance to electrical conduction and to be a fire retardant material.

The electronics of the sensor module is itself modular such that the same electronics may be used in sensor modules for different breakers vendors. As well, the electronics of each sensor module is self-contained such that some signal amplification and filtering may be performed on board the sensor module allowing different levels of signal, amplification as required without the need for any customization of the electronics on the paddle module when handling order of magnitude differences in the power use of different circuits.

Because of the interchangeable nature of the sensor modules, there is also the possibility to incorporate various types of sensors on a paddle board. Induction sensors, hall effect sensors, electric field sensors, temperature sensors and other sensors can all be included in a sensor module along with any filtering, amplification and other signal conditioning hardware that is required to obtain a signal.

Figure 32:
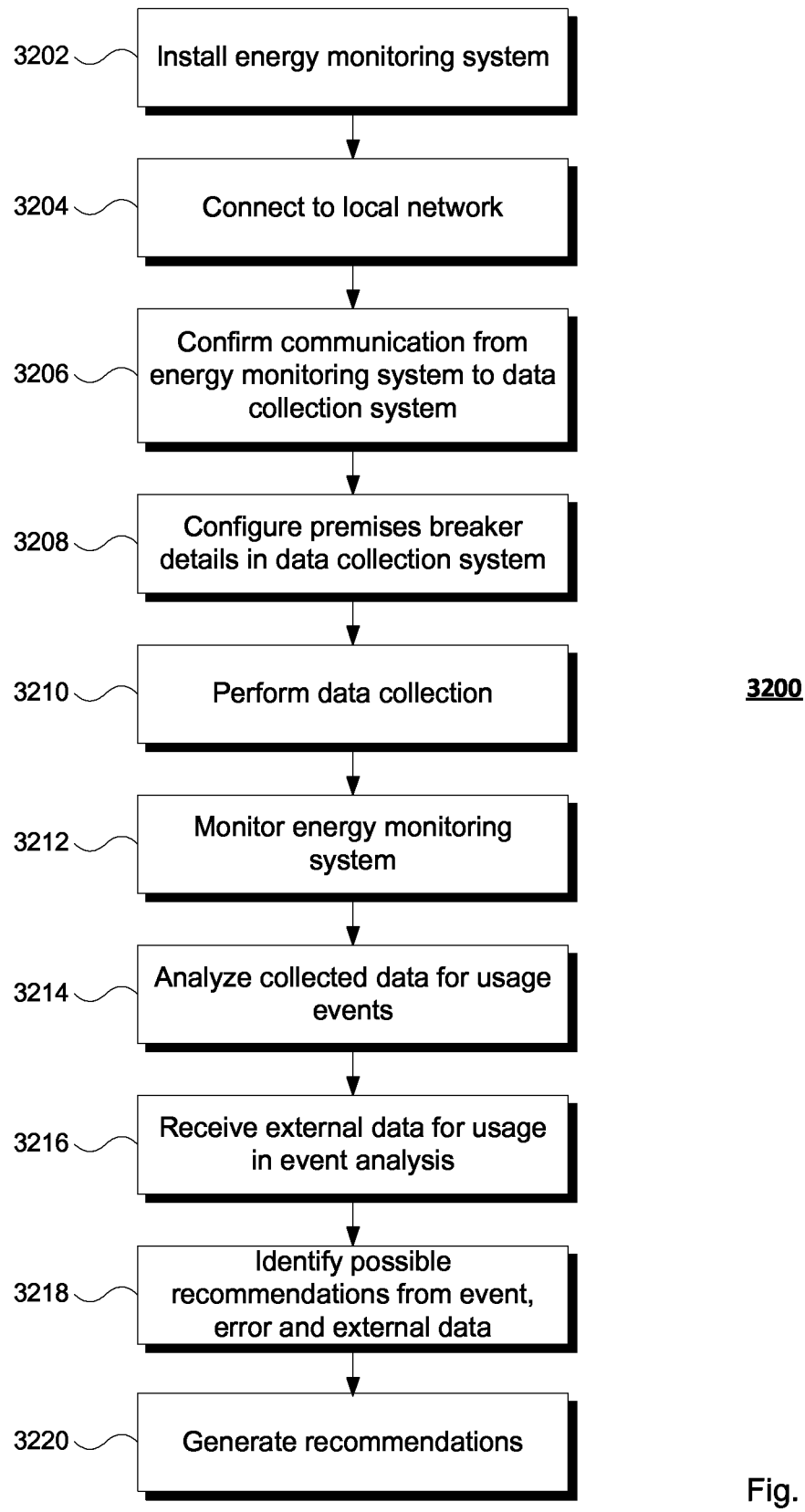
FIG. 32 shows a method flow of event analysis system.

FIG. 32 describes the overall method flow 3200 of the energy analysis system. The energy monitoring system is installed within the breaker on premises (3202). Subsequently, the energy monitoring system is configured with the required settings to talk to the local network on the premises (3204).

With the physical installation performed, the data collection system is informed that an energy monitoring system has been added to the network and attempts to identify that such a device has successfully connected (3206). If the data collection system is informed of the energy monitoring system being added before the energy monitoring system has a chance to connect to the data collection system, the data collection system will continue checking for a period of time to confirm that the device has connected. If the device does not connect within the configured time period, the data collection system will notify system operators of the problem.

With communication now established, the premises breaker details are configured in the data collection system (3208). While this will normally be completed as a part of the energy monitoring system installation, it may also be performed when corrections are required or when changes are made to the electrical panel on the premises.

With physical installation and configuration changes in place, the data collection system will collect the data received from the energy monitoring system and save it for analysis (3210) on an individual circuit breaker level. Collection of the data involves correction of communication errors, decoding of the data and additional filtering before the data is saved in the data storage system so that it can be further processed.

In order to keep the overall energy analysis systems running correctly, the data collection system will regularly check the health of the energy monitoring systems (3212). The system will be checked for basic communications, higher than normal error rates, and installed software versions. If problems are found, they are communicated to the system operators. If updates are required, the communication module will be informed to install the updated software.

When data begins to arrive and be saved by the data collection system, the big data analysis can begin. The data that has been collected and stored in the data storage system will be analyzed for various patterns identifying energy usage (3214) over time. Any patterns that are extracted from the raw data and tagged with additional information will be saved for further analysis.

In addition to the raw data collected from the energy monitoring system, data from numerous external sources will also be collected (3216) by the related data collector 120 from FIG. 1. The exact set of data gathered will vary depending on the use of the system but will be collected in an ongoing manner to be used for analysis. The data is stored along with the raw data in the data storage system.

From the full set of event, error and external data collected and stored in the data storage system, the recommender engine works in an ongoing manner to extract patterns and connections from the data and data relationships. This extracted information is then analyzed by the system and used to identify possible actions that could be taken to achieve desired outcomes. As the recommender engine identifies and extracts unexpected patterns, the system operators and, in some cases, end consumers are notified of new recommended actions and important information (3218).

Recommendations from the recommender engine need to be communicated to interested parties through their preferred communication technologies and to this end, the presenter system combines recommendations with saved preferences to determine what recommendations to communicate (3220). The presenter system then initiates communication to the interested parties in order to provide them with the information appropriate to those preferences.

FIG. 33 a method 3300 for the installation for the event monitoring system. Depending upon the applicable electrical code in a particular region and the design of the electrical panel, installation of the energy monitoring system may require that the main power switch on the breaker panel be shut-off. Although this shut-off of power may be required, the energy monitoring system does not require any change to the electrical wiring. The front of the panel may need to be opened which will need to be done whether or not power is disabled for the remainder of the installation.

With appropriate safety steps taken, the communication module is installed in the breaker panel or near it (3302) depending on whether or not the communication module has a circuit breaker form factor. Installation of the communication module external to the breaker panel can be accomplished using adhesives or screws to attach the communication module beside the breaker panel. Installation of the communication module within the breaker panel for a communication module with circuit breaker form factor will involve pushing the module into an available slot. Depending on the breaker panel design, the communication module may lock in place on its own or may need to be attached in the same way as other circuit breakers in the panel. The communication module may also require a single power wire be attached for some styles of breaker panel.

At any point after the communication module is installed, the premises breaker details can be configured within the data collection system (3304). These details include the name of the circuit and the maximum possible energy usage of the circuit. To configure this information, the installer will typically take a photo of the labeled breaker panel and send this photo to the central system. The label for each circuit will be extracted from the photo either manually or by software image analysis on the data collection system. The software will link the unique identifier of the energy monitoring system with the appropriate information configured in the energy analysis system. The analysis software will also resolve missing or incorrectly labeled circuits and correct these within the configuration.

Once the communication module is in place, a paddle module is assembled for a chosen bank of circuit breakers (3306). Each paddle module will be assembled to fit a specific bank of circuit breakers within the breaker panel. The assembled paddle is then installed on the bank of circuit breakers for which it was configured (3308). Installation will involve holding the paddle module by the handle, aligning it with the bank of circuit breaker and pushing the paddle down into the breakers until the sensor modules align with the circuit breaker screw well and/or external indentations and move no further. There is no need to touch the breaker panel, the circuit breakers or any wiring with the hands when performing the installation.

With the paddle module affixed to the breakers, the connector from the paddle module can then be plugged into a receptacle on the communication module (3310). The slots are numbered for convenience only and there is no need to associate a given paddle with a specific receptacle. The energy analysis system 10 can resolve the associations.

When all the connections have been made in the breaker, communication modules that are not installed within the breaker panel like a circuit breaker will need to be plugged into a standard electrical outlet with a power cord. At this point, with the energy monitoring system physically placed within the panel, the power can be restored if it was disabled. The cover of the breaker panel will also need to be reattached.

Once the energy monitoring system is physically within the panel, it will need to be connected to the network and this requires configuration of the local network settings (3312). When connected through a wired connection, the energy monitoring system will request an IP address from the network and attempt to add itself to the network. When intended to connect with a wireless connection, the energy monitoring system will start up as wireless access point such that any wireless device that can support a web browser can connect to the energy monitoring system to configure the wireless connection. The communication module allows various aspects of wired and wireless networking to be set up through the web interface.

Figure 24:
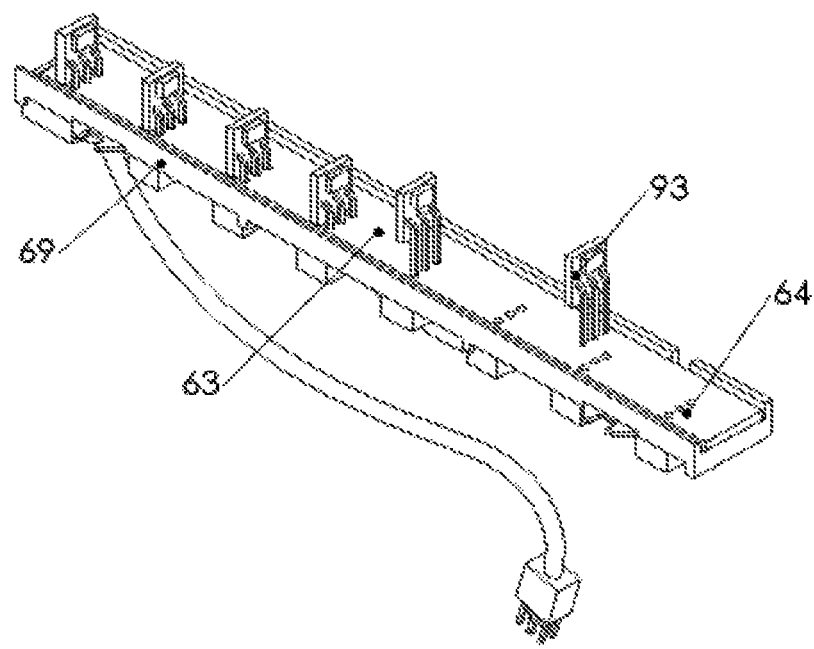
FIG. 24 is a perspective view of the first step in assembling a paddle module.
Figure 25:
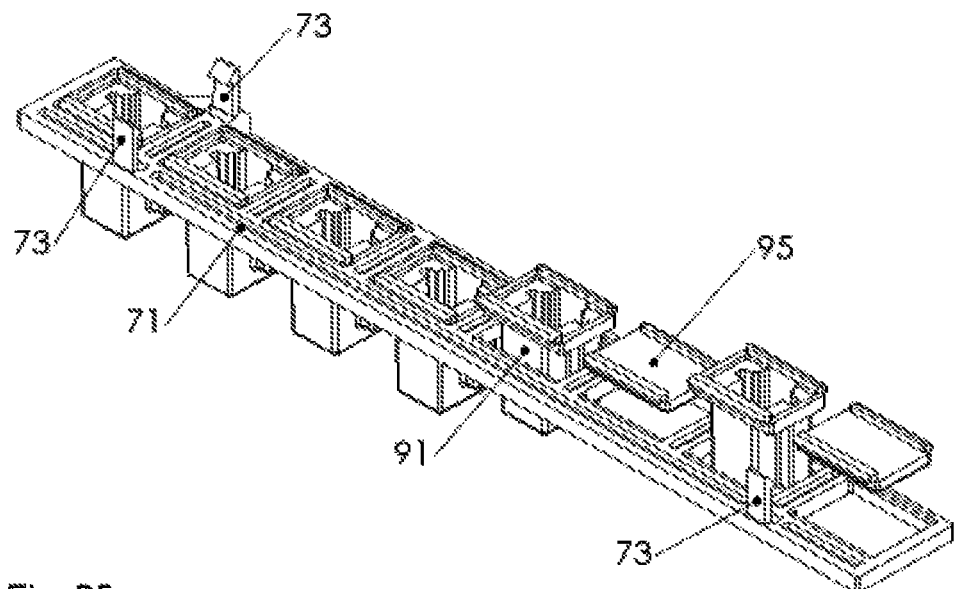
FIG. 25 is a perspective view of the second step in assembling a paddle module.
Figure 34:
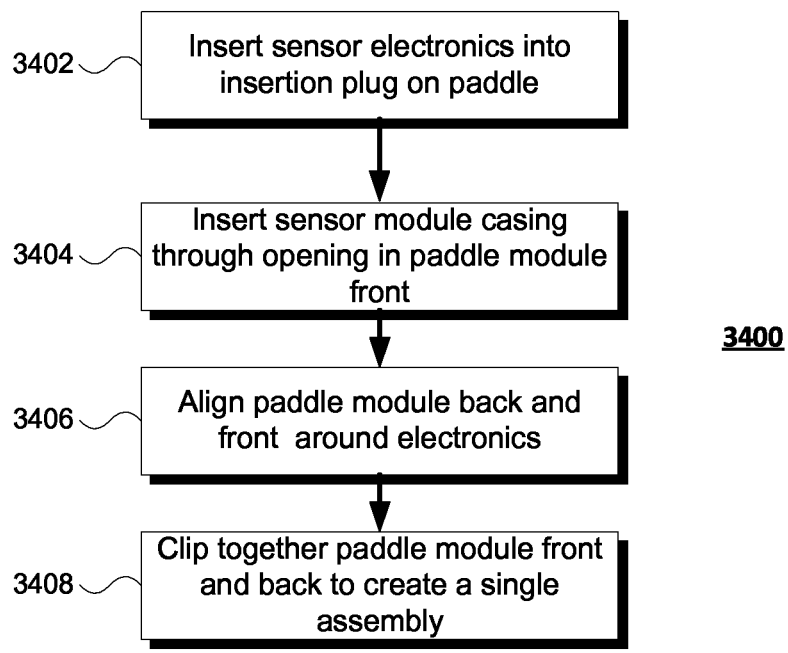
FIG. 34 shows a method flow of paddle module assembly.

The method flow 3400 in FIG. 34 and the diagrams in FIGS. 24, 25, 26, and 27 provide the details of the paddle module assembly. The paddle module back enclosure half 69 is held with the paddle module electronics 63 exposed upward as shown in FIG. 24.

The appropriate sensor electronics 93 are inserted into the insertion plug 64 on the paddle electronics with the arrow markings on the sensor electronics pointing away from the handle (3402). The sensor electronics are chosen based on the current limit for the corresponding breaker and whether a sensor is required for a given position. The process is repeated for each of the sensor insertion plugs that needs to be plugged into the paddle module electronics.

The appropriate sensor module casing 91 as inserted through the opening of the paddle module casing front 71 or alternatively place a blank sensor module casing 95 into that opening if no sensor is required in that position (3404).

Figure 26:
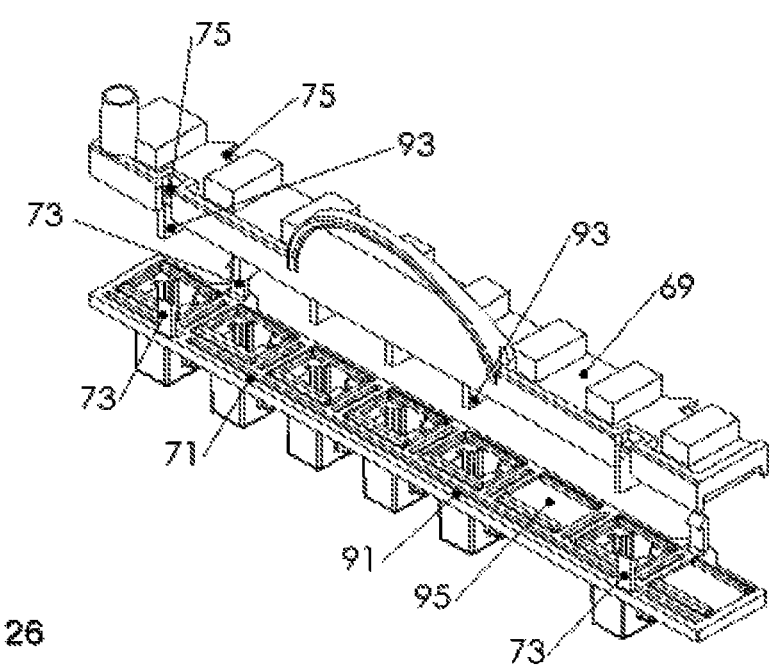
FIG. 26 is a perspective view of the third step in assembling a paddle module.
Figure 27:
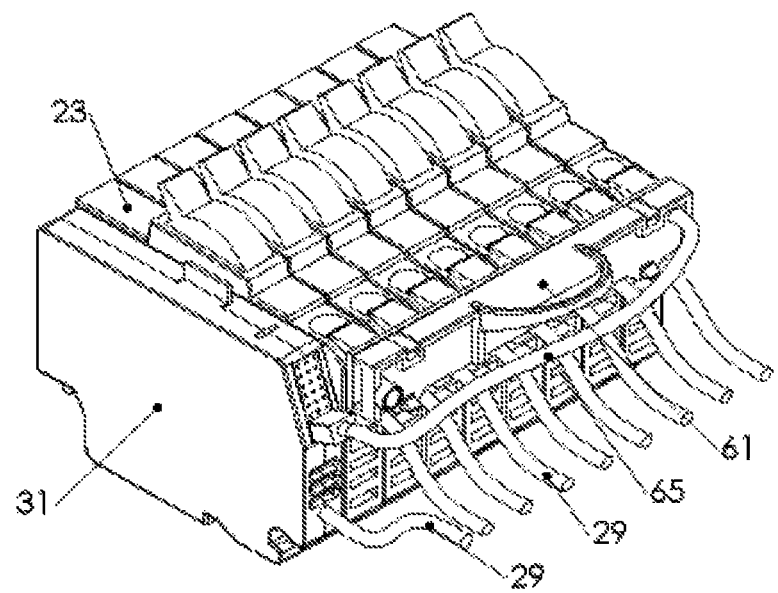
FIG. 27 is a perspective view of the fourth and final step in assembling a paddle module.

The paddle module back 69 and front enclosure halves 71 are aligned are oriented such that the electronics 63 and 93 are between them and the sensor electronics 93 slide into the sensor module casings 91 as per FIG. 26 (3406).

The paddle module front 71 and back 69 are clipped together such that the connector tabs 73 lock into the tab retainers 75 to form a single paddle module unit (3408). The sensors will be able to move slightly at this point but cannot become detached from the paddle module.

FIG. 35 describes the method 3500 of operation for the event monitoring system from the point following installation to regular operation. When the event monitoring system is powered on, it will initialize the system with the configuration information (3502) that was saved either during installation or when either the premises owner or an installer needed to make changes.

Once the communication module is running, it will attempt to find and communicate with each of the attached paddles (3504); raising errors visible through the communication module web interface if a paddle cannot be seen. With the paddles found, each paddle will be interrogated (3506), such that the communication module can know the data transmission rate of the paddle, the type of circuit breaker it is designed for and the details of the data to expect from the paddle. If any errors occur while interrogating the paddles, these too will be visible at the communication module web interface.

After communication with the paddles is working, the communication module will establish communication with the data collection system (3508). This involves the exchange of a series of encrypted messages in which the communication module will first advertise its identity and configuration to the data collection system. The data collection system will then associate the advertised installed hardware of the energy monitoring system with a particular user/subscriber of the system and will then instruct the energy monitoring system on what it should do next.

Communication with the data collection system takes place over a wireless or wired network so will involve the transmission of messages over intermediate equipment such as a combination of Ethernet networks, telephone networks, power line networks and wireless networks. While the low level network messaging of each network will be different, the application level messaging will be largely the same across specific implementations.

With communication established, the data collection system will then be able to clear any recommendations relating to the need to check the operation of the event monitoring system. The communication module will then watch for any configuration or software updates from the data collection system (3510).

At the same time, the communications module will also begin to periodically fire a timer to identify when ongoing usage (non-event) updates should be sent to the data collection system. These periodic messages are heartbeat messages to indicate that the communication module is connected to the network and to communicate the state of the monitoring hardware. The messages also contain a summary of the data for each circuit since the last time that the timer fired. The data collection system will acknowledge these messages and send a response that may make further requests of the energy monitoring system.

The communication module will start to collect the filtered data being received from each of the paddles (3512) and may subsequently perform additional filtering on that data (3514) to make it more usable for the downstream system. The filtered data can then be searched to identify energy usage events (3516) that should be sent to the data collection system of the energy analysis system (3518) where they will be analyzed. Only the data that matches the filtering criteria will be sent and it is sent as it is detected. The communications module will send the data in encrypted form over the communication network with only the relevant detail retained in order to minimize network bandwidth usage.

Identification of energy usage events can involve various signal analysis techniques including, but not limited to, running averages, spike detection, transient analysis and variance analysis.

These and other signal analysis techniques can be used to develop unique device profiles such that future energy usage events can be associated with the same device on the same circuit, across circuits and even across different premises. Likewise, changes in the patterns of device usage and functional operation of individual devices can be detected during analysis. This detailed understanding of the source device and its operation over time and in different premises is important in enabling the entire system to learn about the activity in individual premises.

FIG. 36 outlines the method flow 3600 for communications within the event analysis system starting with initialization of the event monitoring system (3602). After the energy monitoring system establishes its connection to the data collection system of the energy analysis system (3604), the data collection system will confirm that the device is correctly configured, has the right versions of software and is installed in the correct geographic region in order to confirm that the event monitoring system is valid (3606) and up to date. Energy monitoring system data can then be transferred to the energy analysis system (3618).

If the data collection system determines that the event monitoring system needs software updates or configuration changes, the data collection system will itemize the set of updates to be applied to the energy monitoring system (3608). Subsequently, it will let the event monitoring system know of the updates that it needs to make during ongoing communication (3610). It is then up to the event monitoring system to request the configuration and code updates (3614) when possible and to then perform the updates and possibly restart the system (3616) if required.

With successful communications established and versions synchronized between the data collection system and energy analysis system, the energy monitoring will begin to transfer event data to the data collection system (3612) as it happens while the data collection system continues to monitor the connection to the energy monitoring system.

Figure 37:
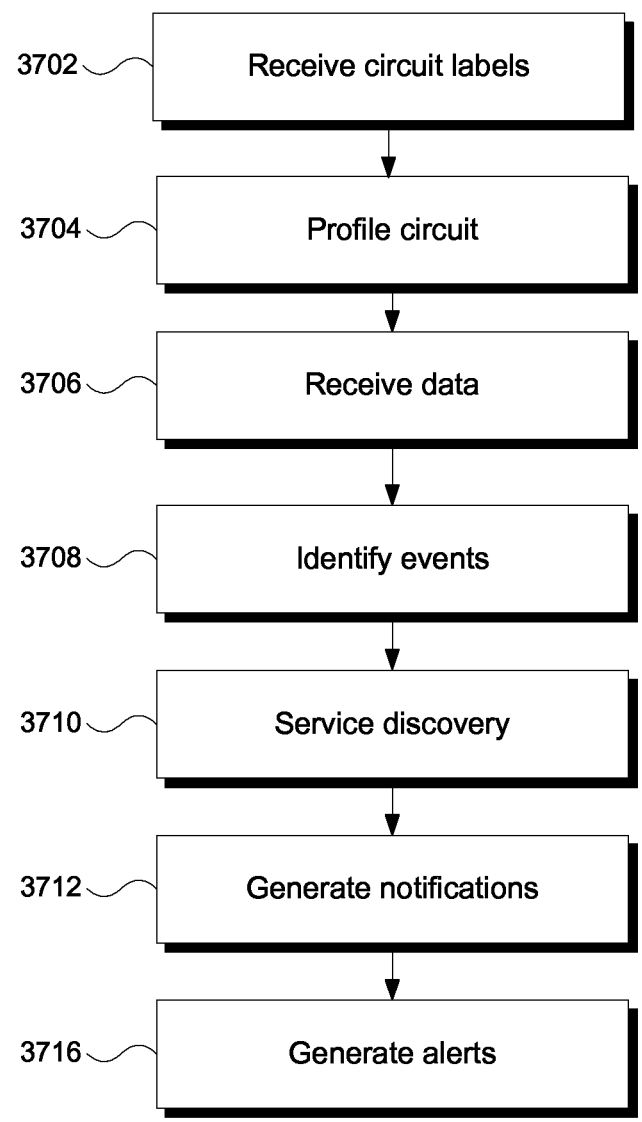
FIG. 37 shows a method of performing energy analysis by the energy analysis system.

FIG. 37 shows a method 3700 of performing energy analysis by the energy analysis system. During the installation of the energy monitoring system the installer can capture a picture of the circuit breaker with the paddle 61 installed. From the photo the energy analysis system can determine sensor location and may also infer the type of circuit size and appliances attached thereto. Alternatively circuit breaker configuration may be manually entered. For example a circuit identified as oven in the breaker panel may enable the energy analysis system to predict the type of event profile and configure the energy monitoring system to collect events accordingly. Alternatively the energy analysis system may determine associated device/appliances based upon collection of usage data. Once the particular energy monitoring system is configured the circuits can be profiled to determine expected energy patterns. The profiling process may be a continuous process to determine changes in usage, connect appliances or loading and may be correlated against external data such as temperature, weather, power deliver events, demand response events; time of use pricing, etc. Data is received from the energy monitoring system (3706). The received data may be pre-filtered by the energy monitoring system and/or may be raw data. From the data, events may be identified (3708) such as the start of an appliance, or changes in the operation of an appliance. Based on the specific events detected and the circuits on which they occur, the energy analysis can recommend services that may be of use to information consumers (3710). Notifications can then be generated based upon the events and recommendations (3712) to be sent to out interested parties. The notifications may be changes in usage patterns, when events start and stop or unexpected events. Alerts can also be generated (3716) for example when anomalous events occurs or when event conditions are not within expected parameters. The data received from the energy monitoring system may be compressed prior to being sent to the energy analysis system. The energy analysis system may also receive maintenance messages regarding operation of the energy monitoring system itself.

Each element in the embodiments of the present disclosure may be implemented as hardware, software/program, or any combination thereof. Software codes, either in its entirety or a part thereof, may be stored in a computer readable medium or memory (e.g., as a ROM, for example a non-volatile memory such as flash memory, CD ROM, DVD ROM, Blu-Ray™, a semiconductor ROM, USB, or a magnetic recording medium, for example a hard disk). The program may be in the form of source code, object code, a code intermediate source and object code such as partially compiled form, or in any other form.

It would be appreciated by one of ordinary skill in the art that the system and components shown in FIGS. 1-37 may include components not shown in the drawings. For simplicity and clarity of the illustration, elements in the figures are not necessarily to scale, are only schematic and are non-limiting of the elements structures. It will be apparent to persons skilled in the art that a number of variations and modifications can be made without departing from the scope of the invention as defined in the claims.

The invention claimed is:

1. An energy monitoring system for monitoring premise-wide power consumption and power usage events of a plurality of circuit breakers in a circuit breaker panel, the system comprising:
a paddle module;
a plurality of interchangeable sensor modules extending from the paddle module, each of the plurality of sensor modules physically interfacing and affixing to an external portion of a respective circuit breaker in the circuit breaker panel, the plurality of interchangeable sensor modules each having a shape corresponding to the shape of the external side of the respective type of circuit breaker wherein the plurality of protrusions defined on an exterior of the respective sensor module defines a shape of the plurality of interchangeable sensor modules ensuring that the exterior of the respective sensor module engages an external portion of the respective circuit breaker thereby providing by a friction fit direct contact with the surface of the respective circuit breaker ensuring consistent and repeatable registration of the sensor module with the respective circuit breaker, each sensor module for sensing current and voltage from the respective circuit breaker and pre-processing the current and voltage to determine starting, alteration or ending events for devices that are coupled to the respective circuit breaker and determining for the respective devices energy consumption to determine events of interest and consumption data; and
a communication module coupled to the paddle module, located at or in the circuit breaker panel, the communication module for relaying the events of interest and consumption data from each of the plurality of circuit breakers sensor modules via the paddle module to a remote management system through a wireless network interface.

2. The energy monitoring system of claim 1 wherein each of the sensor modules has registration, alignment, adhesion, and retention protrusions for engaging a body of the respective circuit breaker.

3. The energy monitoring system of claim 1 wherein the sensor module has sensor selected from the group consisting of a Hall effect sensor, a voltage sensor and an induction sensor.

4. The energy monitoring system of claim 1 wherein the communication module fits in a circuit breaker position of the breaker panel.

5. The energy monitoring system of claim 1 wherein the communication module further comprises an antenna for wireless communication with a networked server.

6. The energy monitoring system of claim 1 wherein the communication module further comprises a network connection interface.

7. The energy monitoring system of claim 1 wherein directed force and friction is used to align the retention and registration protrusions of the sensor module to attach the sensors and paddles to the respective bank of breakers.

8. The energy monitoring system of claim 1 wherein the sensor module is affixed within a screw well or an indentation of the circuit breaker by the respective protrusions of the sensor module such that each sensor module sits at a correct position within the screw well or on the side of the breaker to ensure consistent positioning and measurements.

9. The energy monitoring system of claim 1 further comprising a processor for collecting energy consumption data and events from the one or more sensors and determining an event from the consumption data associated with the circuit.

10. The energy monitoring system of claim 9 wherein the energy consumption data and usage pattern data is provided for each circuit breaker to an energy analysis system.

11. The energy monitoring system of claim 10 wherein the energy consumption data is filtered by the processor to determine events prior to sending the data to the energy analysis system.

12. The energy monitor system of claim 10 wherein the energy analysis system generates a notification or alert in response to receiving an event in the energy consumption data and events.

13. The energy monitoring system of claim 12 wherein an energy analysis system utilizes external network data in conjunction with the energy consumption data and events to determine if the notification or alert should be generated.

14. The energy monitoring system of claim 10 wherein the energy analysis system generates a recommendation based upon the energy consumption, wherein the recommendation is provided to a consumer of the consumption data.

15. An energy monitoring and analysis system for premise-wide power consumption and power usage events of a plurality of circuit breakers, the system comprising:
a plurality of paddle modules;
a plurality of interchangeable sensor modules extending from each of the plurality of paddle modules, each of the plurality of sensor modules physically interfacing and affixing to an external portion of a respective circuit breaker, the plurality of interchangeable sensor modules each having a shape corresponding to the shape of the external side of the respective type of circuit breaker wherein a plurality of protrusions defined on the exterior of the respective sensor module defines a shape of each of the plurality of interchangeable sensor modules ensuring that the exterior of the respective sensor module engages the external portion of the respective circuit breaker thereby providing by a friction fit onto the circuit breaker thereby providing direct contact with the surface of the respective circuit breaker ensuring consistent and repeatable registration of the sensor module with the respective circuit breaker in the circuit breaker panel, each sensor module for sensing current and voltage from the respective circuit breaker and pre-processing the current and voltage to determine starting, alteration of ending events for devices that are couples to the respective circuit breaker and determining for the respective devices energy consumption to determine events of interest and consumption data; and
a plurality of communication modules coupled to respective plurality of the paddle modules, located at or in a respective circuit breaker panel, the communication modules for relaying events of interest and consumption data from each of the plurality of circuit breakers sensor modules via the paddle module to a remote energy monitoring system through a wireless network interface,
the energy monitoring system comprising:
a processor; and
a memory containing instruction which when executed by the processor for performing:
receiving energy consumption data from the plurality of sensor modules extending from a paddle module, each sensor module for determining energy consumption associated with the respective circuit breaker;

determining an event from the received energy consumption data for the respective circuit breaker of the plurality of circuit breakers; and sending the energy consumption data associated with the event for the respective circuit breaker of the plurality of circuit breakers to a network;

an energy analysis system comprising:

a processor; and a memory containing instructions which when executed by the processor for performing:

receiving energy consumption data from the energy monitoring system through the network from the energy monitoring system;

determining a profile of one or more loads connected to the respective circuit breaker of the plurality of circuit breakers associated with the energy consumption data;

determining a notification or alert from the received energy consumption data based upon the profile; and sending the notification or alert to a consumer associated with the energy monitoring system.

16. The system of claim 15 wherein the energy analysis system utilizes external network data in conjunction with the energy consumption data to determine if the notification or alert should be generated.

17. The system of claim 15 wherein the energy analysis system generates a recommendation based upon the energy consumption, wherein the recommendation is provided to a consumer of the consumption data.

18. The system of claim 15 wherein directed force and friction is used to attach the sensor covers from the paddles to the respective bank of breakers.

19. The system of claim 15 wherein the sensor module has sensor selected from the group consisting of a Hall effect sensor, a voltage sensor and an induction sensor.

20. The monitoring system of claim 15 wherein the sensor module is affixed within a screw well or an indentation of the circuit breaker by the respective protrusions of the sensor module such that each sensor module sits at a correct position within the screw well or on the side of the breaker to ensure consistent positioning and measurements.

* * * * *